United States Patent [19]
Onishi

[11] Patent Number: 5,929,490
[45] Date of Patent: Jul. 27, 1999

[54] SEMICONDUCTOR DEVICE WITH AN IMPROVED BODY CONTACT HOLE STRUCTURE

[75] Inventor: Hideaki Onishi, Tokyo, Japan

[73] Assignee: NEC Corporation, Tokyo, Japan

[21] Appl. No.: 09/061,864

[22] Filed: Apr. 17, 1998

[30] Foreign Application Priority Data

Apr. 17, 1997 [JP] Japan ................................. 9-100093

[51] Int. Cl.$^6$ .................................................. H01L 27/01
[52] U.S. Cl. ...................... 257/347; 257/349; 257/352; 257/382; 257/374
[58] Field of Search .................................. 257/347, 349, 257/352, 382, 383, 384, 396, 372, 373, 374

[56] References Cited

U.S. PATENT DOCUMENTS 5,489,792  2/1996  Hu et al. .................................. 257/347

FOREIGN PATENT DOCUMENTS 2-280371  11/1990  Japan .
4-259259   9/1992  Japan .

Primary Examiner—Minh Loan Tran
Attorney, Agent, or Firm—Young & Thompson

[57] ABSTRACT

The present invention provides a contact hole structure in a field effect transistor having a semiconductor layer extending over an insulation region, a control electrode provided on an insulation film on the semiconductor layer, and an inter-layer insulator covering the semiconductor layer and the control electrode. The semiconductor layer further comprises a drain region of a first conductivity type extending on the insulation region, an intermediate region of a second conductivity type extending on the insulation region and also being in contact with the drain region so that the intermediate region is positioned under the control electrode, and a laminated region in contact with the intermediate region so that the laminated region is separated by the intermediate region from the drain region. The laminated region comprises a base layer of the second conductivity type on the insulation region and a source region of the first conductivity type laminated on the base layer. The contact hole structure comprises at least a first contact hole filled with a first contact layer and formed in the inter-layer insulator so that the first contact hole reaches a top surface of the source region, at least a second contact hole filled with a second contact layer and formed in the inter-layer insulator so that the second contact hole penetrates through the source region to reach the base layer, and an electrical isolation layer provided on an inner wall of at least a part of the second contact hole so that the second contact layer within the second contact hole is electrically isolated by the electrical isolation layer from the source region.

40 Claims, 32 Drawing Sheets

SEMICONDUCTOR DEVICE WITH AN IMPROVED BODY CONTACT HOLE STRUCTURE

BACKGROUND OF THE INVENTION

The present invention relates to a semiconductor device, and more particularly to an SOI-MOS field effect transistor.

Semiconductor devices having silicon-on-insulator substrate structures are attractive as being suitable for easy isolation of device and high integration. The SOI semiconductor devices are also free from the problems with latch up phenomenon. The SOI semiconductor devices are further advantageous in those low junction capacitance of the source/drain regions which allows a high speed performance. Such the SOI semiconductor devices are superior than bulk type semiconductor devices in the above described advantages.

Typical one of the conventional SOI-MOS field effect transistors will be described with reference to FIG. 1. A buried silicon oxide layer 2 is provided on a silicon substrate 1. A silicon-on-insulator layer made of silicon is selectively provided on the buried silicon oxide layer 2 so that the silicon-on-insulator layer is electrically isolated by the buried silicon oxide layer 2 from the silicon substrate 1. The silicon-on-insulator layer comprises an n+-type drain region 3, a p--type channel region 5 and an n+-type source region 4. A gate insulation film 7 is selectively provided on the channel region 5. A gate electrode 8 is provided on the gate insulation film 7. Side wall oxide films 9 are provided on opposite sides of the gate electrode 8. An inter-layer insulator 10 is provided which covers the source and drain regions 4 and 3 and the gate electrode 8 with the side wall oxide films 9. Metal interconnections 11 are provided which extend over the inter-layer insulator 10. Contact holes are formed in the inter-layer insulator 10 and over the source and drain regions 4 and 3 and under the metal interconnections 11 so that the contact holes reach the source and drain regions 4 and 3. Contact layers electrically conductive are provided within the contact holes so that the contact layers provide electrical connections between the source/drain regions 4 and 3 and the metal interconnections 11. Namely, the source/drain regions 4 and 3 are electrically connected through the contact layers in the contact holes to the metal interconnections 11.

The source region is applied with a ground voltage whilst the gate electrode 8 and the drain region 3 are applied with positive voltages. If the drain voltage is risen, then a field applied to the junction portion between the drain region 3 and the channel region 5 is increased so that electron-hole pairs are generated at the junction portion between the drain region 3 and the channel region 5. Electrons generated are absorbed by the drain region 4 whilst holes generated are absorbed by the source region 4 but partially. Namely, only a part of the holes generated is absorbed by the source region 4, whilst the remaining part of the holes generated is therefore accumulated in the channel region 5. The accumulation of the holes generated in the channel region 5 results in the increase in potential of the channel region 5. The increase in potential of the channel region 5 results in the drop of the threshold voltage of the device. The increase in potential of the channel region 5 may also cause kink effect which causes a rapid increase in drain current by an application of the drain voltage.

If the drain voltage is furthermore risen, an increase is caused for a ratio of electron injection from the source region 4 into the channel region 5 whereby the field effect transistor enters into a parasitic bipolar transistor operating region wherein the drain current is rapidly increased and further a high voltage characteristic of the field effect transistor is deteriorated. Such the kink effect and the parasitic bipolar transistor operating phenomenon of the field effect transistor provide a remarkable distortion of the output waveform of the field effect transistor.

Since, as described above, the kink effect parasitic bipolar transistor operating phenomenon are caused by the accumulation of holes in the channel region 5, it is required for suppressing the kink effect parasitic bipolar transistor operating phenomenon to discharge the holes from the channel region 5. The above SOI-MOS field effect transistors had been improved to discharge the holes from the channel region 5.

A second conventional SOI-MOS field effect transistor will be described with reference to FIG. 2. This second conventional SOI-MOS field effect transistor is also disclosed in Japanese laid-open Patent Publication No. 2-280371. A silicon-on-insulator layer made of silicon is selectively provided on the buried silicon oxide layer 2 so that the silicon-on-insulator layer is electrically isolated by the buried silicon oxide layer 2 from the silicon substrate 1. The silicon-on-insulator layer comprises p+-type high impurity concentration regions 6, an n+-type drain region 3 laminated on the p+-type high impurity concentration region 6, a p--type channel region 5 and an n+-type source region 4 laminated on the p+-type high impurity concentration region 6. A gate insulation film 7 is selectively provided on the channel region 5. A gate electrode 8 is provided on the gate insulation film 7. Side wall oxide films 9 are provided on opposite sides of the gate electrode 8. An inter-layer insulator 10 is provided which covers the source and drain regions 4 and 3 and the gate electrode 8 with the side wall oxide films 9. Metal interconnections 11 are provided which extend over the inter-layer insulator 10. Source and drain contact holes are formed in the inter-layer insulator 10 and over the source and drain regions 4 and 3 respectively and under the metal interconnections 11 so that the source contact hole penetrates through the source region 4 to reach the p+-type high impurity concentration region 6 under the source region 4 whilst the drain contact hole reaches to the top surface of the drain region 3. Source and drain contact layers electrically conductive are provided within the source and drain contact holes respectively so that the source contact layer not only provides an electrical connection between the metal interconnection 11 and the source region 4 but also provides a short circuit between the p+-type high impurity concentration region 6 and the source region 4 whereby a current path is formed from the channel region 5 through the p+-type high impurity concentration region 6 and the source contact layer to the metal interconnection 11. The current path allows the holes generated in the channel region 5 to withdraw or discharge through the p+-type high impurity concentration region 6 and the source contact layer to the metal interconnection 11.

The above second conventional SOI-MOS field effect transistor is, however, engaged with the following problems and disadvantages. As described above, the short circuit is formed between the p+-type high impurity concentration region 6 and the source region 4, a potential of the p+-type high impurity concentration region 6 is fixed at the source potential of the source region 4. Further, the p+-type high impurity concentration region 6 is of the same conductivity type as the channel region 5, for which reason a potential of the channel region 5 is fixed at the same potential as the source potential of the source region 4. This means it difficult to control the source potential independently so as to control the threshold voltage of the field effect transistor. Furthermore, the drain region 3 has a large area of p-n junction with the p+-type high impurity concentration region 6, for which reason a large parasitic capacitance is formed at the p-n junction between the drain region 3 and the p+-type high impurity concentration region 6.

A third conventional SOI-MOS field effect transistor will be described with reference to FIG. 3. This third conventional SOI-MOS field effect transistor is also disclosed in Japanese laid-open Patent Publication No. 4-259259. A silicon-on-insulator layer made of silicon is selectively provided on the buried silicon oxide layer 2 so that the silicon-on-insulator layer is electrically isolated by the buried silicon oxide layer 2 from the silicon substrate 1. The silicon-on-insulator layer comprises an n+-type drain region 3, a p--type channel region 5, a p+-type high impurity concentration region 6, a p--type low impurity concentration region 5a between the channel region 5 and the p+-type high impurity concentration region 6, and an n+-type source region 4 laminated on the p--type low impurity concentration region 5a. A gate insulation film 7 is selectively provided on the channel region 5. A gate electrode 8 is provided on the gate insulation film 7. Side wall oxide films 9 are provided on opposite sides of the gate electrode 8. An inter-layer insulator 10 is provided which covers the source and drain regions 4 and 3 and the gate electrode 8 with the side wall oxide films 9. Metal interconnections 11 are provided which extend over the inter-layer insulator 10. Source and drain contact holes are formed in the inter-layer insulator 10 and over the source and drain regions 4 and 3 respectively and under the metal interconnections 11 so that the drain and drain contact holes reach the top surfaces of the source and drain regions 4 and 3. Further, an additional contact hole is formed in the inter-layer insulator 10 and over the p+-type high impurity concentration region 6 and under the metal interconnection 11 so that the additional contact hole reaches the top surface of the p+-type high impurity concentration region 6. Source and drain contact layers electrically conductive are provided within the source and drain contact holes respectively so that the source and drain contact layers provide electrical connections between the metal interconnection 11 and the source and drain regions 4 and 3. An additional contact layer is also provided within the additional contact hole so that the additional contact layer provides an electrical connection between the p+-type high impurity concentration region 6 and the metal interconnection 11 thereby to form a current path. The current path allows the holes generated in the channel region 5 to withdraw or discharge through the p--type low impurity concentration region 5a, the p+-type high impurity concentration region 6 and the additional contact layer to the metal interconnection 11.

The above third conventional SOI-MOS field effect transistor is capable of controlling the potentials of the source region and the channel region independently from each other because the current path for discharging the holes is formed separately from the source region. Further, the drain region 3 is directly in contact with the buried silicon oxide layer 2. This makes the transistor free from the problem with a large parasitic capacitance involved in the p-n junction. The above third conventional SOI-MOS field effect transistor is, however, engaged with the following other problems and disadvantages. As illustrated in FIG. 3, the p+-type high impurity concentration region 6 is formed outside the source region 4 to ensure the independent current path for discharging the holes. This means that the above transistor requires a large area, resulting in a difficulty in realizing a high integration of the transistor.

A fourth conventional SOI-MOS field effect transistor will be described with reference to FIGS. 4, 5A and 5B. This fourth conventional SOI-MOS field effect transistor is also disclosed in IEEE Transactions On Electron devices, Vol. 35, No. 8, August 1988, pp. 1391–1393. FIG. 4 is a plane view illustrative of this conventional SOI-MOS field effect transistor. FIG. 5A is a fragmentary cross sectional elevation view illustrative of this conventional SOI-MOS field effect transistor taken along an 5A—5A line of FIG. 4. FIG. 5B is a fragmentary cross sectional elevation view illustrative of this conventional SOI-MOS field effect transistor taken along a 5B—5B line of FIG. 4. A silicon-on-insulator layer made of silicon is selectively provided on the buried silicon oxide layer 2 so that the silicon-on-insulator layer is electrically isolated by the buried silicon oxide layer 2 from the silicon substrate 1. The silicon-on-insulator layer comprises p--type low impurity concentration regions 5a, a p--type channel region 5 between the p--type low impurity concentration regions 5a, a p+-type high impurity concentration region 6 laminated on a part of the p--type low impurity concentration region 5a, an n+-type source region 4 laminated on the remaining part of the p--type low impurity concentration region 5a, and an n+-type drain region 3 laminated on the p--type low impurity concentration region 5a. The p+-type high impurity concentration region 6 and the n+-type source region 4 are provided alternately in a channel width direction as illustrated in FIG. 4. A gate insulation film 7 is selectively provided on the channel region 5. A gate electrode 8 is provided on the gate insulation film 7. Side wall oxide films 9 are provided on opposite sides of the gate electrode 8. An inter-layer insulator 10 is provided which covers the source and drain regions 4 and 3 and the gate electrode 8 with the side wall oxide films 9. Metal interconnections 11 are provided which extend over the inter-layer insulator 10. Source and drain contact holes are formed in the inter-layer insulator 10 and over the source and drain regions 4 and 3 respectively and under the metal interconnections 11 so that the drain and drain contact holes reach the top surfaces of the source and drain regions 4 and 3 respectively as illustrated in FIG. 5A. Further, an additional contact hole is formed in the inter-layer insulator 10 and over the p+-type high impurity concentration region 6 and under the metal interconnection 11 so that the additional contact hole reaches the top surface of the p+-type high impurity concentration region 6 as illustrated in FIG. 5B. Source and drain contact layers electrically conductive are provided within the source and drain contact holes respectively so that the source and drain contact layers provide electrical connections between the metal interconnection 11 and the source and drain regions 4 and 3. An additional contact layer is also provided within the additional contact hole so that the additional contact layer provides an electrical connection between the p+-type high impurity concentration region 6 and the metal interconnection 11 thereby to form a current path. The current path allows the holes generated in the channel region 5 to withdraw or discharge through the p--type low impurity concentration region 5a, the p+-type high impurity concentration region 6 and the additional contact layer to the metal interconnection 11.

The above fourth conventional SOI-MOS field effect transistor is, however, engaged with the following problems and disadvantages. As well illustrated in FIG. 4, the source regions 4 and the p+-type high impurity concentration regions 6 are alternatively aligned in the opposite side to the drain region. This means that the area of the source region 4 is reduced. Namely, the width of the source region 4 is narrowed. The reduction in width or area of the source region results in the drop of the driving current of the transistor. In order to prevent the drop of the driving current of the transistor, it is effective to enlarge the size of the transistor. This enlargement in size of the transistor makes it difficult to realize the required high integration of the transistor. Further, as described above, the drain region 3 has a large area of p-n junction with the p---type low impurity concentration region 5a, for which reason a large parasitic capacitance is formed at the p-n junction between the drain region 3 and the p---type low impurity concentration region 5a.

In the above circumstances, it had been required to develop a novel semiconductor device with an improved contact hole structure free from the above problems and disadvantages.

SUMMARY OF THE INVENTION

Accordingly, it is an object of the present invention to provide a novel contact hole structure of a semiconductor device free from the above problems.

It is a further object of the present invention to provide a novel contact bole structure of a semiconductor device which is suitable for realizing a high integration.

It is a still further object of the present invention to provide a novel contact hole structure of a semiconductor device which is capable of control a source potential and a channel potential independently from each other.

It is yet a further object of the present invention to provide a novel contact hole structure of a semiconductor device which allows a drain region to have no large parasitic capacitance due to p-n junction.

It is a further more object of the present invention to provide a novel contact hole structure of a semiconductor device which allows a substantive scaling down and a size reduction of the device.

It is still more object of the present invention to provide a novel contact hole structure of a semiconductor device which allows the device to exhibit high speed performances.

It is moreover object of the present invention to provide a novel contact hole structure of a semiconductor device which allows the device to possess a high driving current.

It is another object of the present invention to provide a novel SOI-MOS field effect transistor with an improved contact hole structure free from the above problems.

It is still another object of the present invention to provide a novel SOI-MOS field effect transistor with an improved contact hole structure which is suitable for realizing a high integration.

It is yet another object of the present invention to provide a novel SOI-MOS field effect transistor with an improved contact hole structure which is capable of control a source potential and a channel potential independently from each other.

It is further another object of the present invention to provide a novel SOI-MOS field effect transistor with an improved contact hole structure which allows a drain region to have no large parasitic capacitance due to p-n junction.

It is an additional object of the present invention to provide a novel SOI-MOS field effect transistor with an improved contact hole structure which allows a substantive scaling down and a size reduction of the device.

It is a still additional object of the present invention to provide a novel SOI-MOS field effect transistor with an improved contact hole structure which allows the device to exhibit high speed performances.

It is yet an additional object of the present invention to provide a novel SOI-MOS field effect transistor with an improved contact hole structure which allows the device to possess a high driving current.

The above and other objects, features and advantages of the present invention will be apparent from the following descriptions.

The present invention provides a contact hole structure in a field effect transistor having a semiconductor layer extending over an insulation region, a control electrode provided on an insulation film on the semiconductor layer, and an inter-layer insulator covering the semiconductor layer and the control electrode. The semiconductor layer further comprises a drain region of a first conductivity type extending on the insulation region, an intermediate region of a second conductivity type extending on the insulation region and also being in contact with the drain region so that the intermediate region is positioned under the control electrode, and a laminated region in contact with the intermediate region so that the laminated region is separated by the intermediate region from the drain region. The laminated region comprises a base layer of the second conductivity type on the insulation region and a source region of the first conductivity type laminated on the base layer. The contact hole structure comprises at least a first contact hole filled with a first contact layer and formed in the inter-layer insulator so that the first contact hole reaches a top surface of the source region, at least a second contact hole filled with a second contact layer and formed in the inter-layer insulator so that the second contact hole penetrates through the source region to reach the base layer, and an electrical isolation layer provided on an inner wall of at least a part of the second contact hole so that the second contact layer within the second contact hole is electrically isolated by the electrical isolation layer from the source region.

BRIEF DESCRIPTION OF THE DRAWINGS

Preferred embodiments according to the present invention will be described in detail with reference to the accompanying drawings.

DISCLOSURE OF THE INVENTION

Figure 1:
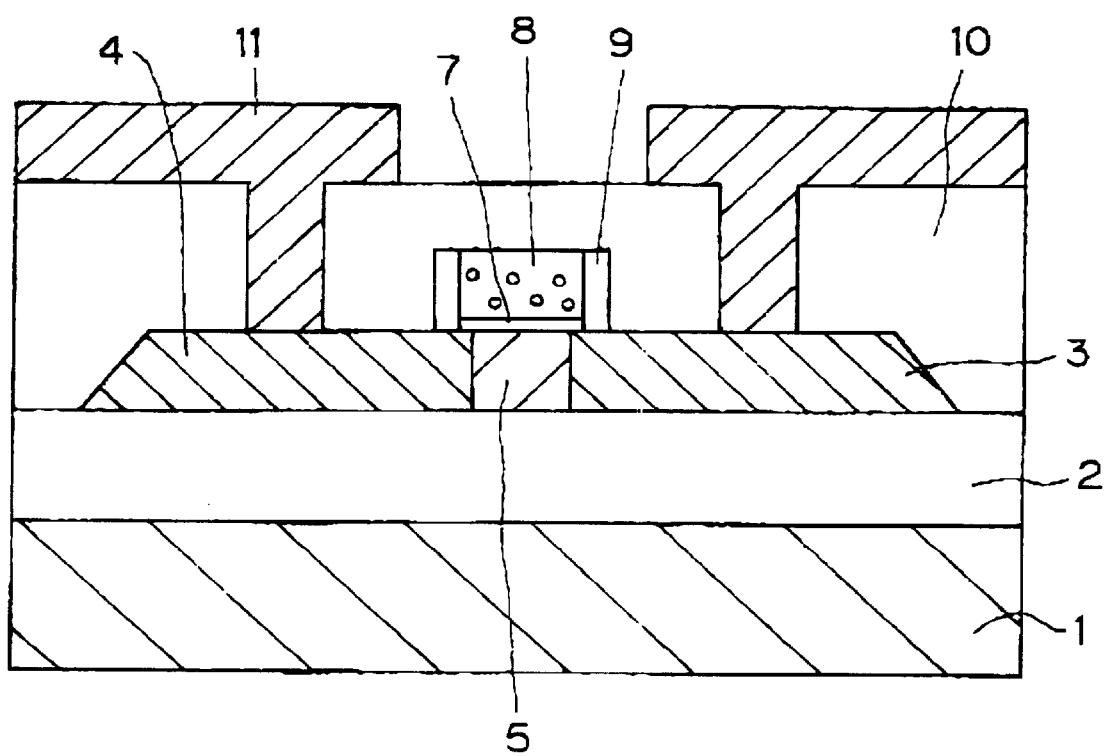
FIG. 1 is a fragmentary cross sectional elevation view illustrative of a first conventional SOI-MOS field effect transistor.
Figure 2:
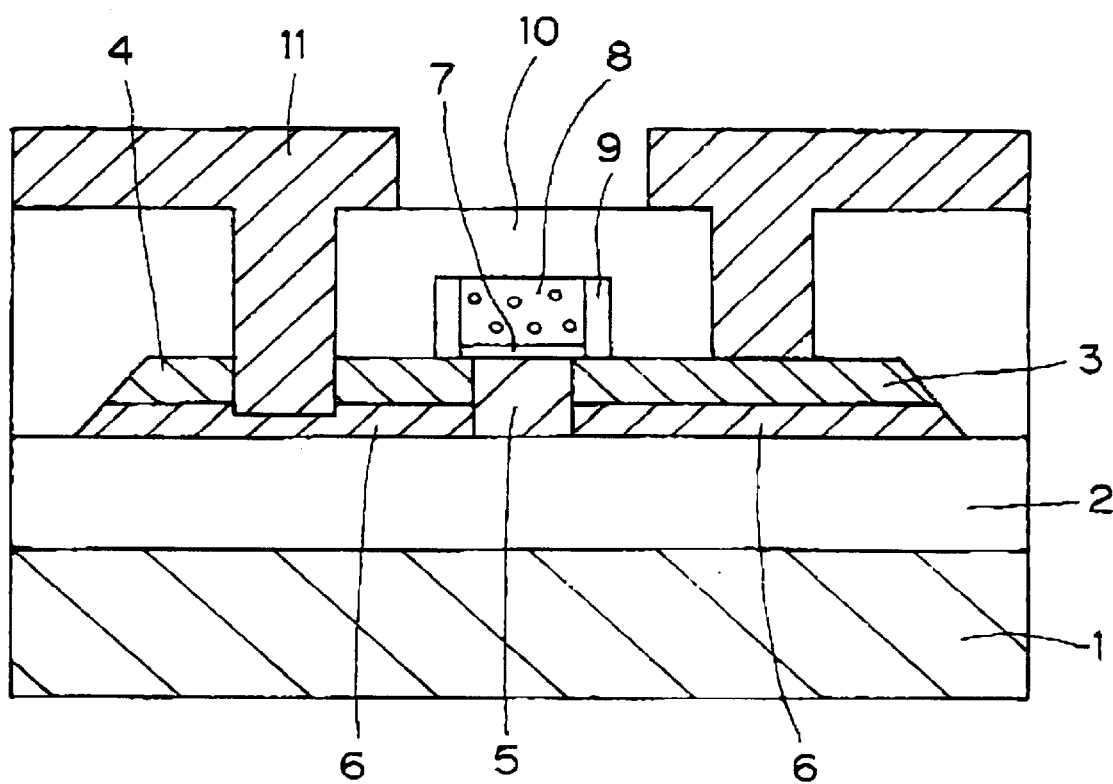
FIG. 2 is a fragmentary cross sectional elevation view illustrative of a second conventional SOI-MOS field effect transistor with body contact holes.
Figure 3:
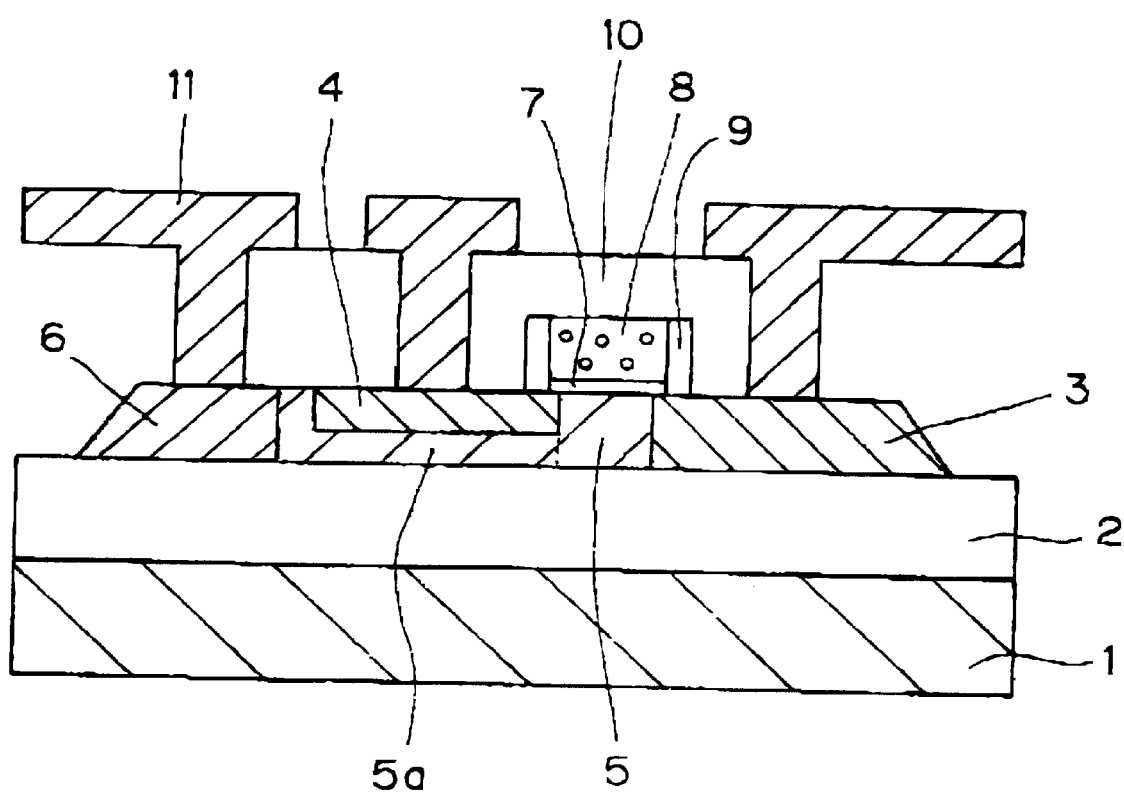
FIG. 3 is a fragmentary cross sectional elevation view illustrative of a third conventional SOI-MOS field effect transistor with body contact holes.
Figure 4:
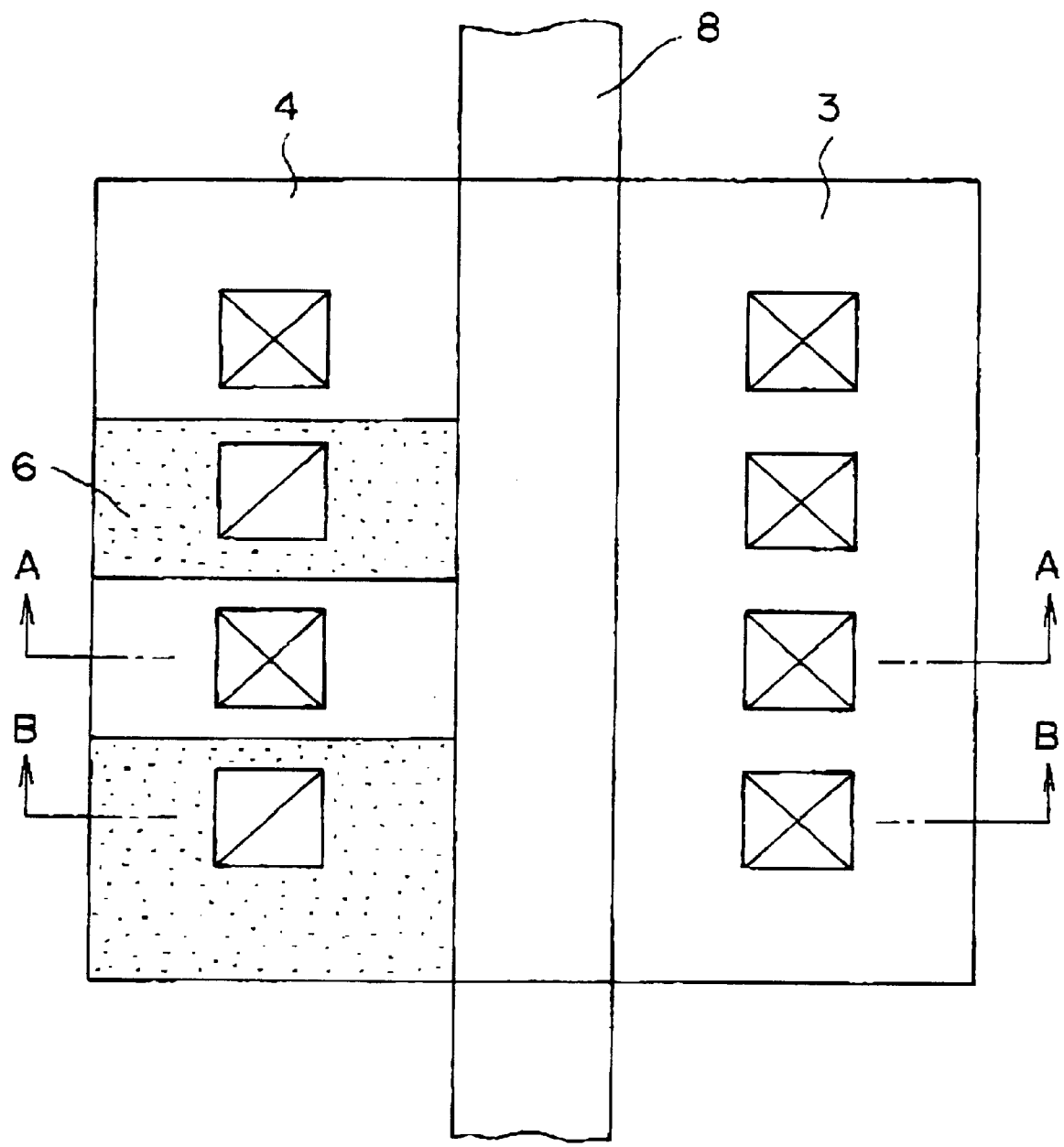
FIG. 4 is a plane view illustrative of a fourth conventional SOI-MOS field effect transistor with body contact holes.
Figure 5A:
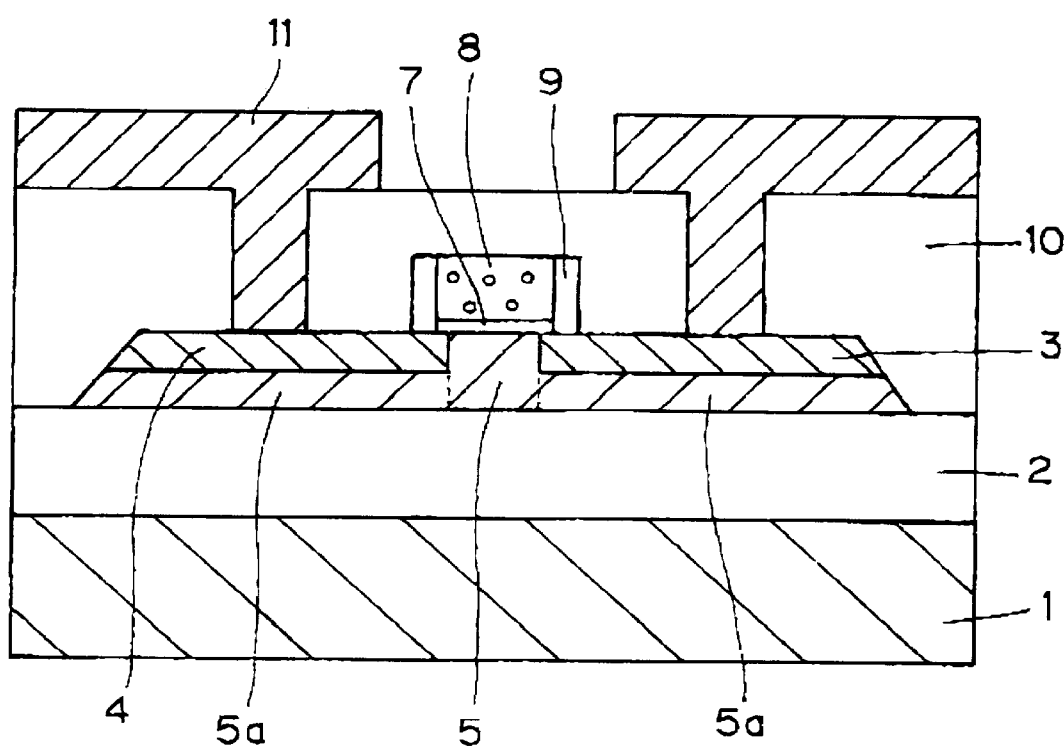
FIG. 5A is a fragmentary cross sectional elevation view illustrative of a fourth conventional SOI-MOS field effect transistor with body contact holes taken along an 5A—5A line of FIG. 4.
Figure 5B:
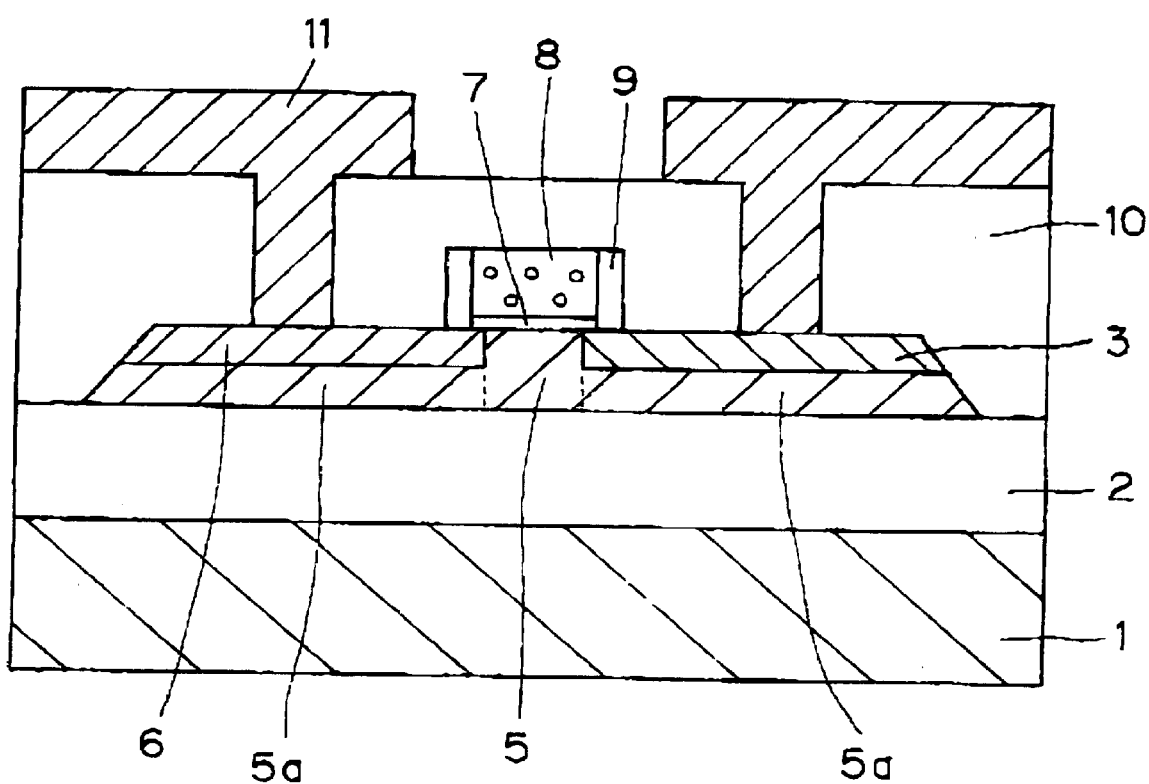
FIG. 5B is a fragmentary cross sectional elevation view illustrative of a fourth conventional SOI-MOS field effect transistor with body contact holes taken along a 5B—5B line of FIG. 4.

The first present invention provides a contact hole structure in a field effect transistor having a semiconductor layer extending over an insulation region, a control electrode provided on an insulation film on the semiconductor layer, and an inter-layer insulator covering the semiconductor layer and the control electrode. The semiconductor layer further comprises a drain region of a first conductivity type extending on the insulation region, an intermediate region of a second conductivity type extending on the insulation region and also being in contact with the drain region so that the intermediate region is positioned under the control electrode, and a laminated region in contact with the intermediate region so that the laminated region is separated by the intermediate region from the drain region. The laminated region comprises a base layer of the second conductivity type on the insulation region and a source region of the first conductivity type laminated on the base layer. The contact hole structure comprises at least a first contact hole filled with a first contact layer and formed in the inter-layer insulator so that the first contact hole reaches a top surface of the source region, at least a second contact hole filled with a second contact layer and formed in the inter-layer insulator so that the second contact hole penetrates through the source region to reach the base layer, and an electrical isolation layer provided on an inner wall of at least a part of the second contact hole so that the second contact layer within the second contact hole is electrically isolated by the electrical isolation layer from the source region.

It is preferable that the second contact layer is in directly contact with the base layer.

It is also preferable to further provide a high impurity concentration layer of the second conductivity type having a higher impurity concentration than that of the base layer, wherein the high impurity concentration layer is provided on a bottom of the second contact hole so that the second contact layer within the second contact hole is in indirectly contact through the high impurity concentration layer to the base layer. In this case, it is further preferable that the electrical isolation layer is provided on the inner wall of the second contact hole so that the second contact layer within the second contact hole is electrically isolated by the electrical isolation layer from the source region and also from the base layer, and so that the second contact layer within the second contact hole is in indirectly contact through the high impurity concentration layer to the base layer.

It is also preferable that the electrical isolation layer is provided on an entire of the inner wall of the second contact hole.

It is also preferable that a plurality of the first contact holes and a plurality of the second contact holes are provided to be aligned alternately. In this case, it is further preferable that the first and second contact holes are so aligned as to have the same distance from the control electrode.

It is also preferable that the insulation region comprises a buried insulation layer extending over a semiconductor substrate.

It is also preferable that the insulation region comprises an insulation substrate.

It is also preferable that the insulation region comprises an semi-insulation substrate.

The second present invention provides a source contact hole structure formed in an insulation layer over a source region of a first conductivity type extending on a base layer of a second conductivity, wherein the source contact hole structure comprises at least a first contact hole filled with a first contact layer and formed in the inter-layer insulator so that the first contact hole reaches a top surface of the source region, at least a second contact hole filled with a second contact layer and formed in the inter-layer insulator so that the second contact hole penetrates through the source region to reach the base layer, and an electrical isolation layer provided on an inner wall of at least a part of the second contact hole so that the second contact layer within the second contact hole is electrically isolated by the electrical isolation layer from the source region.

It is preferable that the second contact layer is in directly contact with the base layer.

It is also preferable to further provide a high impurity concentration layer of the second conductivity type having a higher impurity concentration than that of the base layer, wherein the high impurity concentration layer is provided on a bottom of the second contact hole so that the second contact layer within the second contact hole is in indirectly contact through the high impurity concentration layer to the base layer. In this case, it is further preferable that the electrical isolation layer is provided on the inner wall of the second contact hole so that the second contact layer within the second contact hole is electrically isolated by the electrical isolation layer from the source region and also from the base layer, and so that the second contact layer within the second contact hole is in indirectly contact through the high impurity concentration layer to the base layer.

It is also preferable that the electrical isolation layer is provided on an entire of the inner wall of the second contact hole.

It is also preferable that a plurality of the first contact holes and a plurality of the second contact holes are provided to be aligned alternately.

The third present invention provides a field effect transistor having the following structure. A semiconductor layer extends over an insulation region. The semiconductor layer further comprises a drain region of a first conductivity type extending on the insulation region, a channel region of a second conductivity type extending on the insulation region and also being in contact with the drain region, and a laminated region in contact with the intermediate region so that the laminated region is separated by the intermediate region from the drain region. The laminated region comprises a base layer of the second conductivity type on the insulation region and a source region of the first conductivity type laminated on the base layer. A gate insulation film is provided on the channel region. A gate electrode is provided on the insulation film. An inter-layer insulator is provided which covers the semiconductor layer and the gate electrode. The contact hole structure comprises at least a first contact hole filled with a first contact layer and formed in the inter-layer insulator so that the first contact hole reaches a top surface of the source region, at least a second contact hole filled with a second contact layer and formed in the inter-layer insulator so that the second contact hole penetrates through the source region to reach the base layer, and an electrical isolation layer provided on an inner wall of at least a part of the second contact hole so that the second contact layer within the second contact hole is electrically isolated by the electrical isolation layer from the source region.

It is preferable that the second contact layer is in directly contact with the base layer.

It is also preferable to further provide a high impurity concentration layer of the second conductivity type having a higher impurity concentration than that of the base layer, wherein the high impurity concentration layer is provided on a bottom of the second contact hole so that the second contact layer within the second contact hole is in indirectly contact through the high impurity concentration layer to the base layer. In this case, it is further preferable that the electrical isolation layer is provided on the inner wall of the second contact hole so that the second contact layer within the second contact hole is electrically isolated by the electrical isolation layer from the source region and also from the base layer, and so that the second contact layer within the second contact hole is in indirectly contact through the high impurity concentration layer to the base layer.

It is also preferable that the electrical isolation layer is provided on an entire of the inner wall of the second contact hole.

It is also preferable that a plurality of the first contact holes and a plurality of the second contact holes are provided to be aligned alternately. In this case, it is further preferable that the first and second contact holes are so aligned as to have the same distance from the gate electrode.

It is also preferable that the insulation region comprises a buried insulation layer extending over a semiconductor substrate.

It is also preferable that the insulation region comprises an insulation substrate.

It is also preferable that the insulation region comprises an semi-insulation substrate.

The fourth present invention provides a field effect transistor having the following structure. A buried insulation layer extends on a semiconductor substrate. A semiconductor-on-insulation layer made of a semiconductor is provided which extends over the buried insulation layer. The semiconductor-on-insulation layer further comprises a drain region of a first conductivity type extending on the buried insulation layer, a channel region of a second conductivity type extending on the buried insulation layer and also being in contact with the drain region, and a laminated region in contact with the intermediate region so that the laminated region is separated by the intermediate region from the drain region. The laminated region comprises a base layer of the second conductivity type on the buried insulation layer and a source region of the first conductivity type laminated on the base layer. A gate insulation film is provided on the channel region. A gate electrode is provided on the insulation film. An inter-layer insulator is provided which covers the semiconductor layer and the gate electrode. The contact hole structure comprises at least a first contact hole filled with a first contact layer and formed in the inter-layer insulator so that the first contact hole reaches a top surface of the source region, at least a second contact hole filled with a second contact layer and formed in the inter-layer insulator so that the second contact hole penetrates through the source region to reach the base layer, and an electrical isolation layer provided on an inner wall of at least a part of the second contact hole so that the second contact layer within the second contact hole is electrically isolated by the electrical isolation layer from the source region.

It is preferable that the second contact layer is in directly contact with the base layer.

It is also preferable to further provide a high impurity concentration layer of the second conductivity type having a higher impurity concentration than that of the base layer, wherein the high impurity concentration layer is provided on a bottom of the second contact hole so that the second contact layer within the second contact hole is in indirectly contact through the high impurity concentration layer to the base layer. In this case, it is further preferable that the electrical isolation layer is provided on the inner wall of the second contact hole so that the second contact layer within the second contact hole is electrically isolated by the electrical isolation layer from the source region and also from the base layer, and so that the second contact layer within the second contact hole is in indirectly contact through the high impurity concentration layer to the base layer.

It is also preferable that the electrical isolation layer is provided on an entire of the inner wall of the second contact hole.

It is also preferable that a plurality of the first contact holes and a plurality of the second contact holes are provided to be aligned alternately. In this case, it is further preferable that the first and second contact holes are so aligned as to have the same distance from the gate electrode.

The fifth present invention provides a field effect transistor having the following structure. A semiconductor-on-insulation layer made of a semiconductor is provided which extends over the insulation substrate. The semiconductor-on-insulation layer further comprises a drain region of a first conductivity type extending on the insulation substrate, a channel region of a second conductivity type extending on the insulation substrate and also being in contact with the drain region, and a laminated region in contact with the intermediate region so that the laminated region is separated by the intermediate region from the drain region. The laminated region comprises a base layer of the second conductivity type on the insulation substrate and a source region of the first conductivity type laminated on the base layer. A gate insulation film is provided on the channel region. A gate electrode is provided on the insulation film. An inter-layer insulator is provided which covers the semiconductor layer and the gate electrode. The contact hole structure comprises at least a first contact hole filled with a first contact layer and formed in the inter-layer insulator so that the first contact hole reaches a top surface of the source region, at least a second contact hole filled with a second contact layer and formed in the inter-layer insulator so that the second contact hole penetrates through the source region to reach the base layer, and an electrical isolation layer provided on an inner wall of at least a part of the second contact hole so that the second contact layer within the second contact hole is electrically isolated by the electrical isolation layer from the source region.

It is preferable that the second contact layer is in directly contact with the base layer.

It is also preferable to further provide a high impurity concentration layer of the second conductivity type having a higher impurity concentration than that of the base layer, wherein the high impurity concentration layer is provided on a bottom of the second contact hole so that the second contact layer within the second contact hole is in indirectly contact through the high impurity concentration layer to the base layer. In this case, it is further preferable that the electrical isolation layer is provided on the inner wall of the second contact hole so that the second contact layer within the second contact hole is electrically isolated by the electrical isolation layer from the source region and also from the base layer, and so that the second contact layer within the second contact hole is in indirectly contact through the high impurity concentration layer to the base layer.

It is also preferable that the electrical isolation layer is provided on an entire of the inner wall of the second contact hole.

It is also preferable that a plurality of the first contact holes and a plurality of the second contact holes are provided to be aligned alternately. In this case, it is further preferable that the first and second contact holes are so aligned as to have the same distance from the gate electrode.

PREFERRED EMBODIMENTS

First Embodiment

Figure 6:
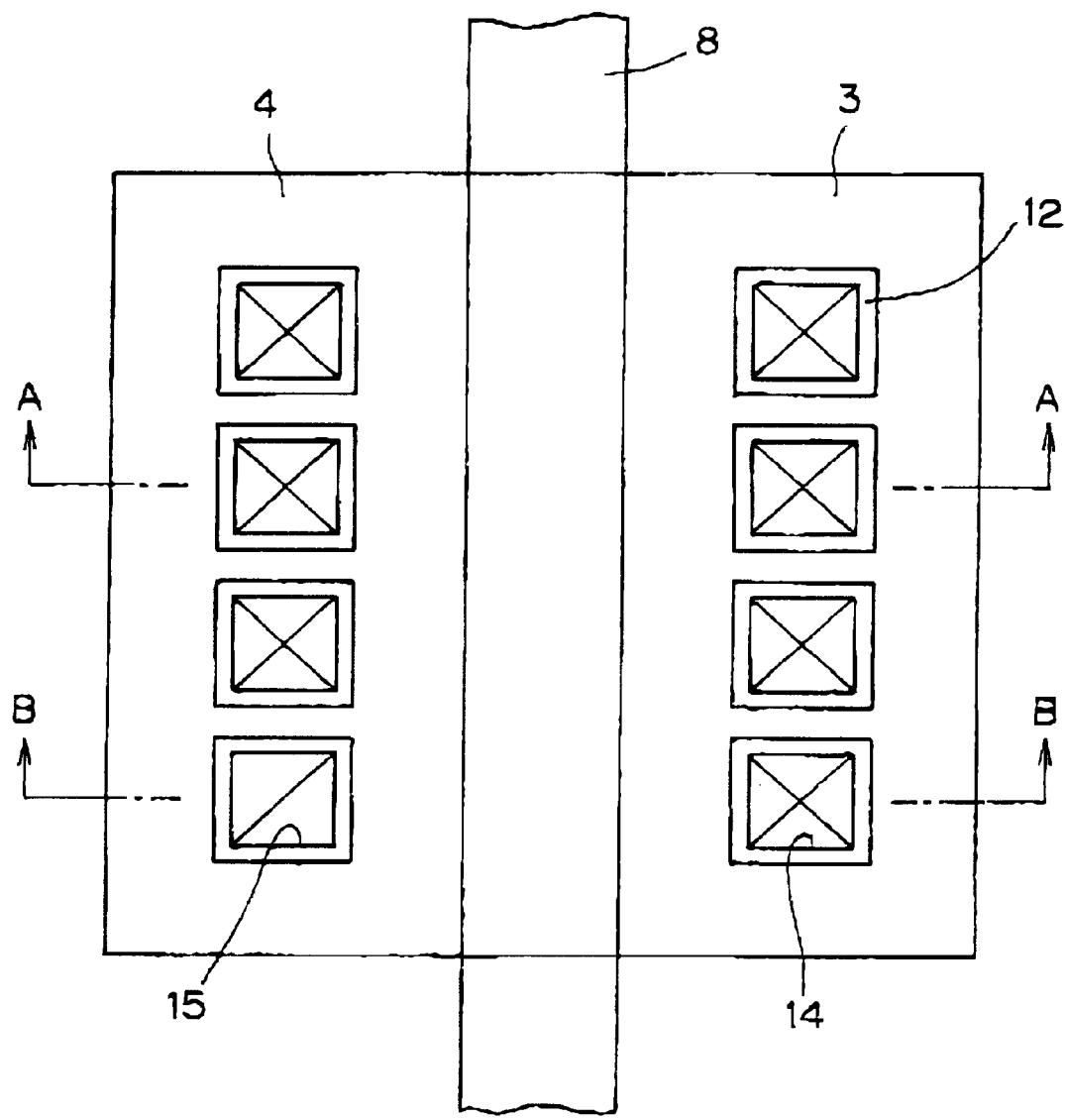
FIG. 6 is a plane view illustrative of a novel SOI-MOS field effect transistor with body contact holes in a first embodiment in accordance with the present invention.
Figure 7A:
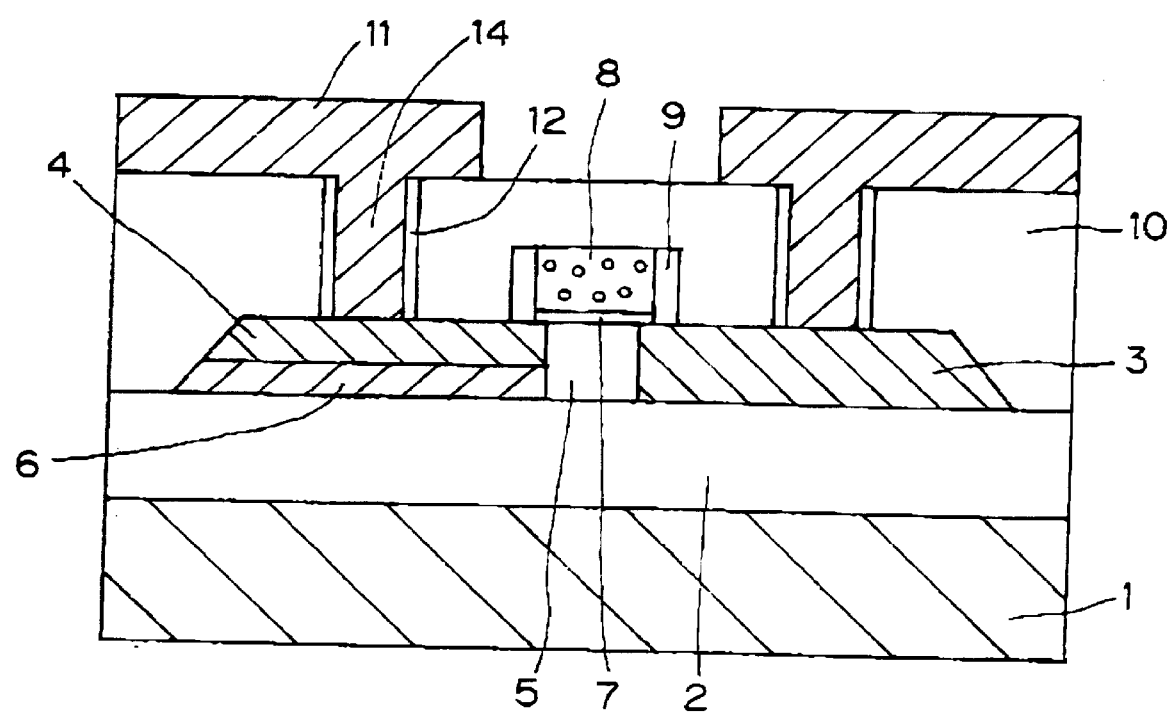
FIG. 7A is a fragmentary cross sectional elevation view illustrative of a novel SOI-MOS field effect transistor with body contact holes taken along 7A—7A line of FIG. 6 in a first embodiment in accordance with the present invention.
Figure 7B:
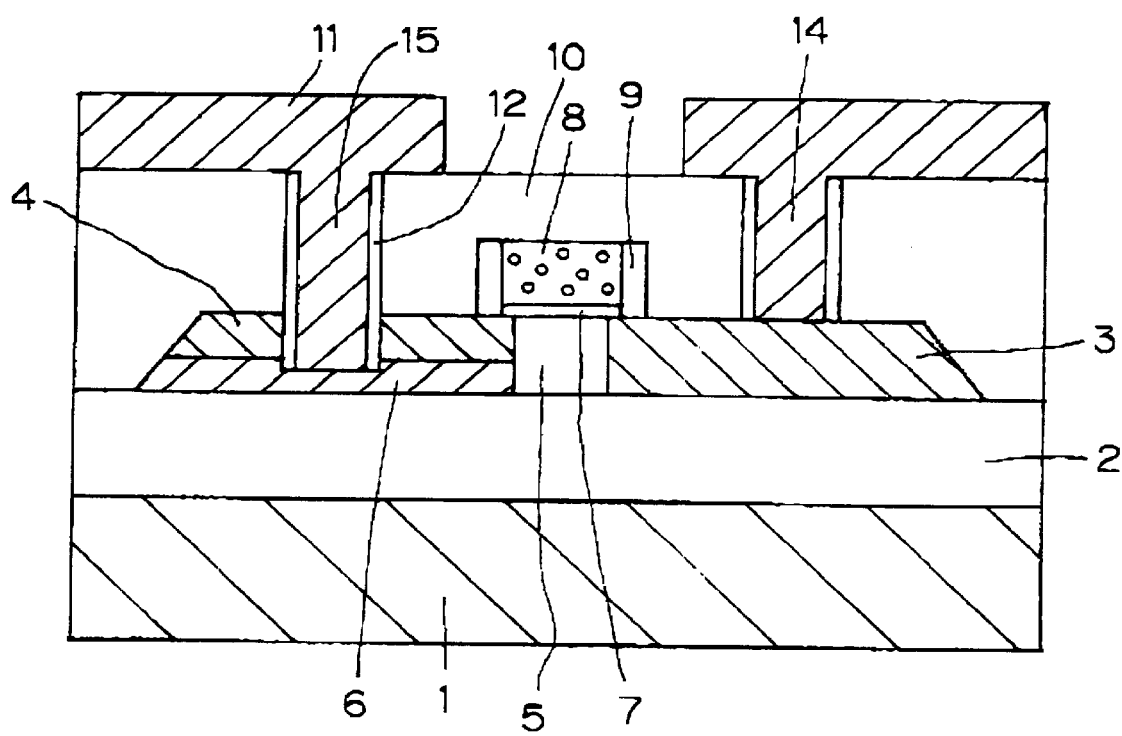
FIG. 7B is a fragmentary cross sectional elevation view illustrative of a novel SOI-MOS field effect transistor with body contact holes taken along a 7B—7B line of FIG. 6 in a first embodiment in accordance with the present invention.

A first embodiment according to the present invention will be described in detail with reference to FIGS. 6, 7A and 7B. A novel SOI-MOS field effect transistor with an improved body contact structure is provided. A buried silicon oxide layer 2 is provided on a silicon substrate 1. A silicon-on-insulator layer made of silicon is selectively provided on the buried silicon oxide layer 2 so that the silicon-on-insulator layer is electrically isolated by the buried silicon oxide layer 2 from the silicon substrate 1. The silicon-on-insulator layer comprises a p+-type high impurity concentration region 6, an n+-type drain region 3, an n+-type source region 4 laminated on the p+-type high impurity concentration region 6 and a p--type channel region 5 between the source and drain regions 4 and 3. The drain region 3 is directly contact with the buried silicon oxide layer 2. A gate insulation film 7 is selectively provided on the channel region 5. A gate electrode 8 is provided on the gate insulation film 7. Side wall oxide films 9 are provided on opposite sides of the gate electrode 8. An inter-layer insulator 10 is provided which covers the source and drain regions 4 and 3 and the gate electrode 8 with the side wall oxide films 9. Metal interconnections 11 are provided which extend over the inter-layer insulator 10. Source and drain contact holes 14 are formed in the inter-layer insulator 10 and over the source and drain regions 4 and 3 respectively and under the metal interconnections 11 so that the source and drain contact holes 14 reach the top surface of the source and drain regions 4 and 3 respectively. Further, body contact holes 15 are formed in the inter-layer insulator 10 and over the source region 4 and under the metal interconnection 11 so that the body contact hole 15 penetrates through the source region 4 to reach the p+-type high impurity concentration region 6. The source contact holes 14 and the body contact holes 15 are alternately aligned in a channel width direction as well illustrated in FIG. 6. Source and drain hole insulation layers 12 are provided on inner walls of the source and drain contact holes 14 respectively. Source and drain contact layers electrically conductive are provided within the source and drain contact holes 14 respectively so that the source and drain contact layers provide electrical connections between the metal interconnection 11 and the source and drain regions 4 and 3. Further the body contact holes 15 have inner walls which are covered by body contact hole insulation films 12. Body contact layers electrically conductive are provided in the body contact holes 15 coated by the body contact hole insulation films 12 so that the body contact layer provides an electrical connection between the p+-type high impurity concentration region 6 and the metal interconnection 11, whereby a current path is formed from the channel region 5 through the p+-type high impurity concentration region 6 and the body contact layer to the metal interconnection 11. The current path allows the holes generated in the channel region 5 to withdraw or discharge through the p+-type high impurity concentration region 6 and the body contact layer to the metal interconnection 11.

The body contact hole insulation film 12 electrically isolate the body contact layer from the source region 4 so that no short circuit is formed between the p+-type high impurity concentration region 6 and the source region 4. This means that the potential of the p+-type high impurity concentration region 6 is independent from the source potential of the source region 4. The potential of the channel region 5 is not fixed at the same potential as the source potential of the source region 4. The above body contact hole structure makes it possible to control the channel potential of the channel region 5 and the source potential of the source region 4 independently. Namely, the channel potential of the channel region 5 is controllable independently from the control of the source potential of the source region 4. This means that the threshold voltage of the transistor is desirably controllable by controlling the channel potential of the channel region 5.

The above novel body contact hole structure forms the current path for withdrawing and discharging holes from the channel region 5. The current path allows holes generated in the channel region 5 to discharge or withdraw through the p+-type high impurity concentration region 6, the body contact layer within the body contact hole 15 to the metal interconnection 11. The above current path allows the transistor to be free from the problems with the kink effects and parasitic bipolar transistor effects.

The above novel body contact hole structure does not require any enlargement in area for providing an additional element, for which reason the above novel body contact hole structure allows realization of high integration of the transistor and a substantive scaling down or size reduction of the transistor.

Further, the above novel body contact hole structure allows the source region to extend almost entirely in an opposite side to the drain region. This means that the source region is allowed to have a sufficiently large width for permitting the transistor to have a sufficiently high driving current.

Furthermore, the drain region is provided in contact directly with the buried silicon oxide layer 2 thereby to form no parasitic capacitance at the p-n junction on the bottom of the drain region. This allows the transistor to exhibit high speed performances.

The following descriptions will focus on the fabrication processes for the above novel SOI-MOS field effect transistor with the improved contact hole structure.

Figure 8A:
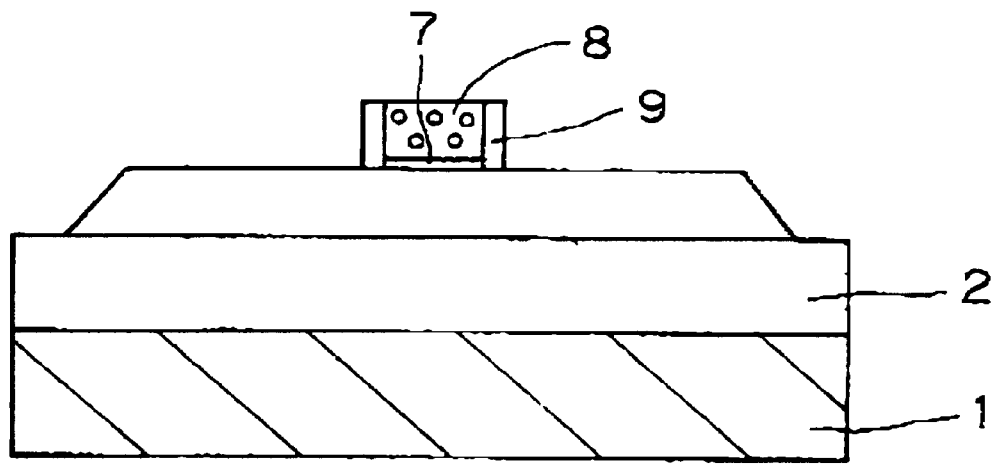
FIGS. 8A through 8H are fragmentary cross sectional elevation views illustrative of novel SOI-MOS field effect transistors with body contact holes sequential steps involved in a novel method of forming the same in a first embodiment in accordance with the present invention.

With reference to FIG. 8A, a buried silicon oxide layer 2 is formed on a silicon substrate 1. A silicon-on-insulator layer made of silicon is then selectively formed on the buried silicon oxide layer 2 so that the silicon-on-insulator layer has a thickness of 150 nanometers. A mesa type isolation method is carried out. Before or after this mesa type isolation method, an ion-implantation of boron into the silicon-on-insulator layer 5 is carried out so that the silicon-on-insulator layer has an impurity concentration in the order of $10^{-17}$ to $10^{-18}$ cm$^{-3}$ for channel doping thereby to form a p--type low impurity concentration region, a part of which will become a channel region. A thermal oxidation of silicon is carried out to form a gate oxide film 7 having a thickness of 7 nanometers. A low pressure chemical vapor deposition is carried out to deposit a polysilicon film on the gate oxide film 7. An ion-implantation of phosphorus into the polysilicon film is carried out to form a phosphorus highly doped polysilicon film. A photo-resist pattern is formed on the phosphorus highly doped polysilicon film by use of a photo-lithography technique. A dry etching process is then carried out for patterning the phosphorus highly doped polysilicon film thereby to form a gate electrode 8 over the gate oxide film 7. A chemical vapor deposition is carried out to entirely deposit a silicon oxide film having a thickness of 100 nanometers which covers the gate electrode 8 and the silicon-on-insulator layer 5 for subsequent etch back process to the silicon oxide film to selectively leave the silicon oxide film only on opposite side walls of the gate electrode 8, whereby side wall oxide films 9 are formed on the opposite side walls of the gate electrode 8.

Figure 8B:
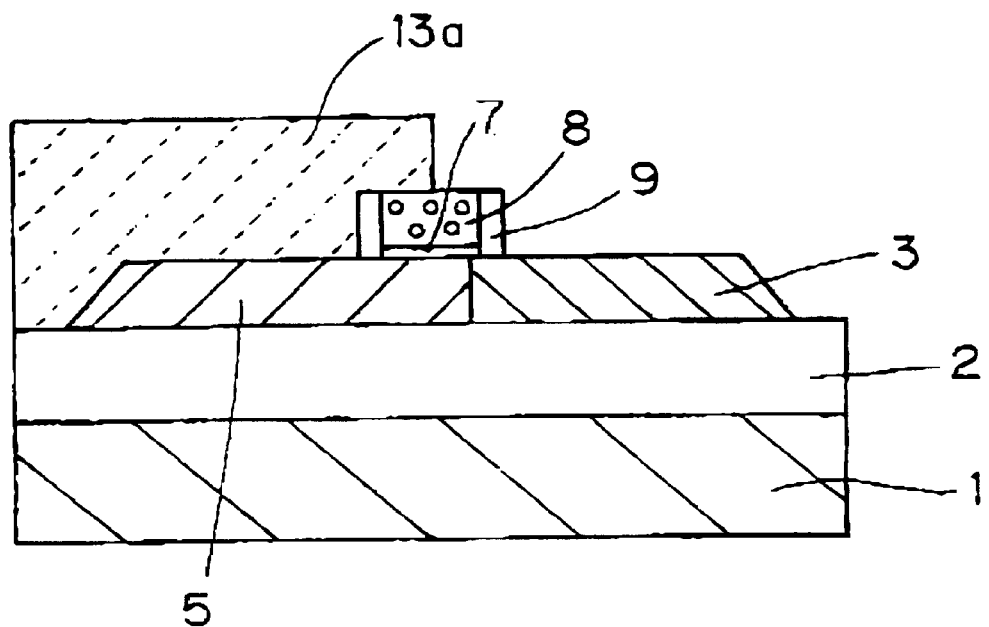

With reference to FIG. 8B, a photo-resist film 13a is formed by a photo-lithography technique so that the photo-resist film 13a extends over a source formation region of the silicon-on-insulator layer 5 and a part of the gate electrode 8. An ion-implantation of arsenic into the source formation region of the silicon-on-insulator layer 5 is carried out by use of the photo-resist film 13a as a mask at an ion-implantation energy of 80 keV and such a dose that the drain formation region of the silicon-on-insulator layer 5 has an impurity concentration of about $5 \times 10^{20}$ cm$^{-3}$ whereby a drain region 3 is formed in the silicon-on-insulator layer 5.

Figure 8C:
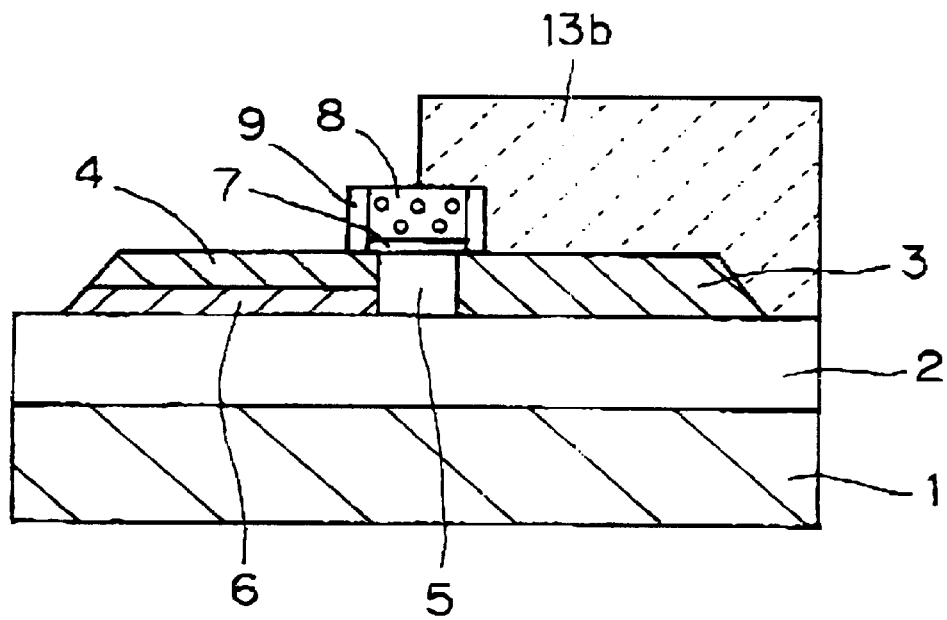

With reference to FIG. 8C, the used photo-resist film 13a is removed. Thereafter, another photo-resist film 13b is selectively formed by a photo-lithography technique so that the photo-resist film 13b extends over the drain region 3 and another part of the gate electrode 8. An ion-implantation of boron into in a lower half region of the source formation region of the silicon-on-insulator layer 5 is carried out by use of the photo-resist film 13b as a mask at an ion-implantation energy of 60 keV and such a dose that the source formation region of the silicon-on-insulator layer 5 has an impurity concentration of about $5 \times 10^{20}$ cm$^{-3}$ whereby a p+-type high impurity concentration region 6 is formed in the lower half region of the source formation region of the silicon-on-insulator layer 5. Subsequently, a further ion-implantation of arsenic into an upper half region of the source formation region of the silicon-on-insulator layer 5 is carried out by use of the photo-resist film 13b as a mask at an ion-implantation energy of 30 keV and such a dose that the upper half region of the source formation region of the silicon-on-insulator layer 5 has an impurity concentration of about $5 \times 10^{20}$ cm$^{-3}$ whereby a source region 4 is formed over the p+-type high impurity concentration region 6.

Figure 8D:
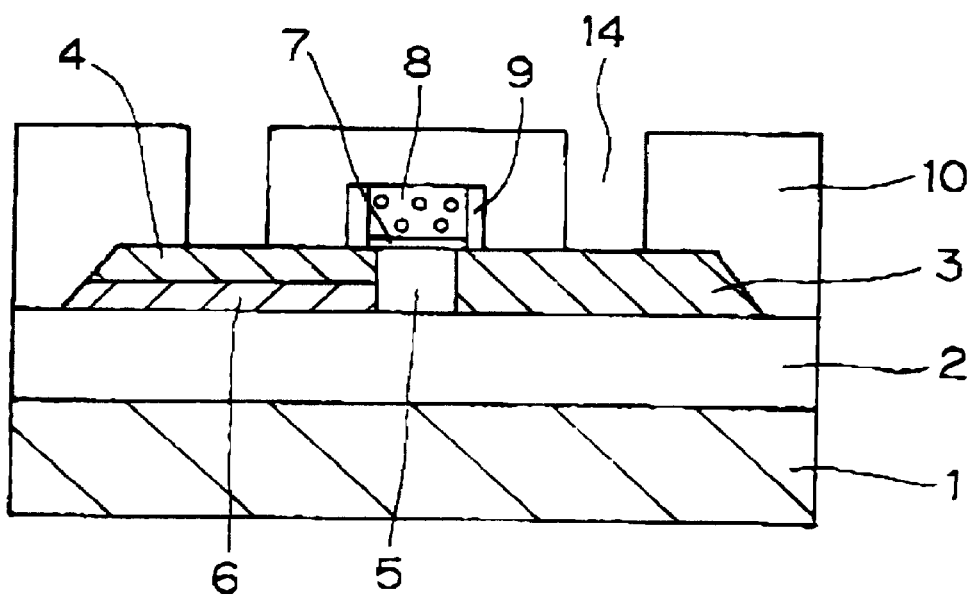

With reference to FIG. 8D, the used photo-resist film 13b is removed. Thereafter, a rapid thermal anneal is carried out at a temperature of about 1000° C. for 10 seconds for causing activations of the impurities of boron and arsenic. A chemical vapor deposition is carried out to entirely deposit an inter-layer insulator 10 made of boro-phospho silicate glass so that the inter-layer insulator 10 covers the source and drain regions 4 and 3 and the gate electrode 8 as well as the side wall oxide films 9 and the buried silicon oxide layer 2. The deposited inter-layer insulator 10 is then planarized by reflow process. A photo-resist film is formed over the inter-layer insulator 10 by use of the photo-lithography technique. A dry etching process to the inter-layer insulator 10 is carried out by use of the photo-resist film as a mask to form contact holes 14 in the inter-layer insulator 10 so that the contact holes 14 just reach the top surfaces of the source region 4 and the drain region 3. Namely, the top surfaces of the source region 4 and the drain region 3 are partially shown through the contact holes 14. The used photo-resist film is then removed.

Figure 8E:
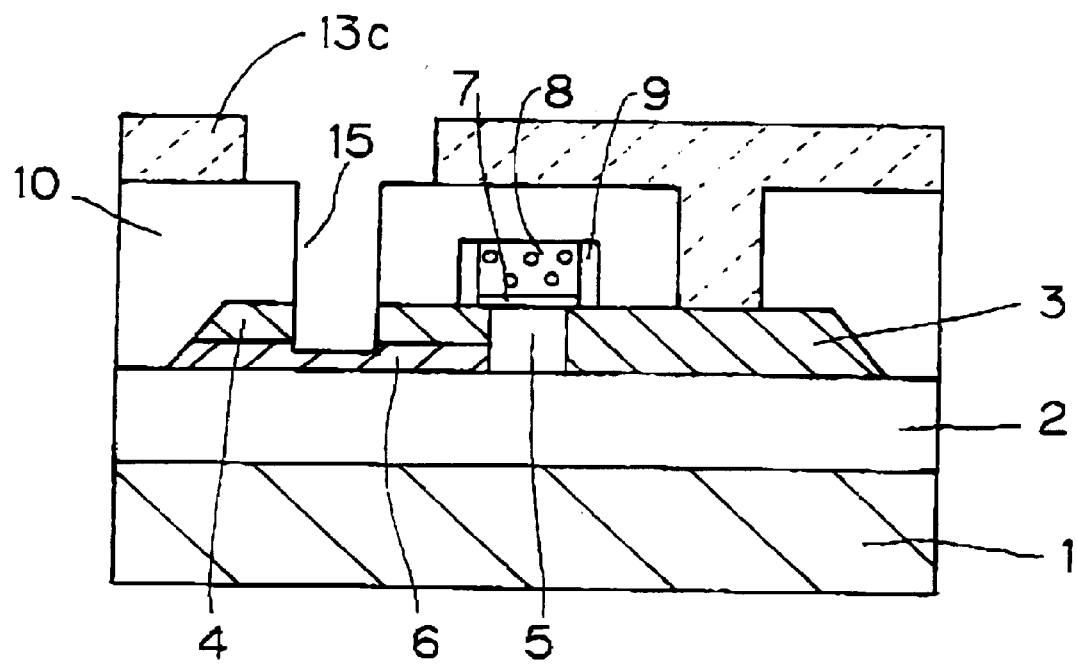

With reference to FIG. 8E, a photo-resist film 13c is formed over the inter-layer insulator 10 by the photo-lithography technique so that the photo-resist film 13c has openings which are positioned alternately over the holes 14 formed over the source region 4. An anisotropic etching to the source region 4 and the p+-type high impurity concentration region 6 is carried out to the source contact holes 14 alternatively under the openings of the photo-resist film 13c so as to further extend downwardly so as to form body contact holes 15 which penetrate through the source region 4 to reach an intermediate level of the p+-type high impurity concentration region 6. The body contact holes 15 and the source contact holes 14 are aligned alternately over the source region 4, wherein the body contact holes 15 penetrate through the source region 4 to reach the intermediate level of the p+-type high impurity concentration region 6 whilst the source contact holes 14 just reach the top surface of the source region 4. The drain contact holes 14 also just reach the top surface of the drain region 3. The used photo-resist film 13c is removed.

Figure 8F:
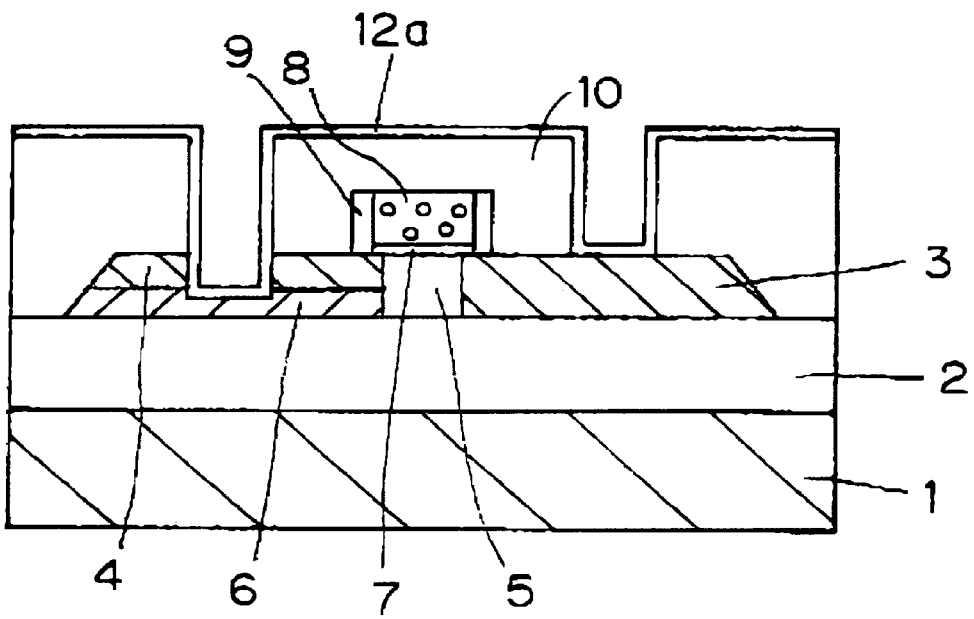

With reference to FIG. 8F, a chemical vapor deposition is carried out to entirely deposit a silicon oxide film 12a which covers the top surface of the inter-layer insulator 10 and side walls and bottoms of each of the body contact holes 15 and the source and drain contact holes 14. The silicon oxide film 12a has a thickness of about 20 nanometers.

Figure 8G:
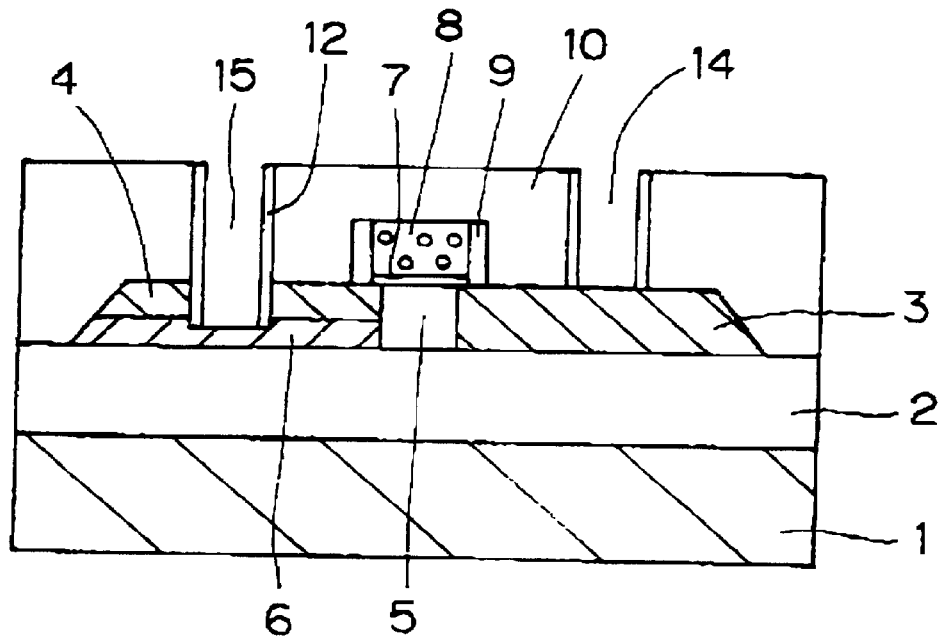

With reference to FIG. 8G, an anisotropic etching to the silicon oxide film 12a is carried out so that the silicon oxide film 12a remains only on the inner walls of each of the body contact holes 15 and the source and drain contact holes 14 whereby body contact hole silicon oxide films 12 are formed on the inner walls of the body contact holes 15 and the source/drain contact hole silicon oxide films 12 are also formed on the inner walls of the source and drain contact holes 14. As a result, the top surfaces of the source and drain regions 4 and 3 are shown through the source and drain contact holes 14 having the inner walls covered by the silicon oxide films 12 whilst the p+-type high impurity concentration region 6 is shown through the body contact holes 15.

Figure 8H:
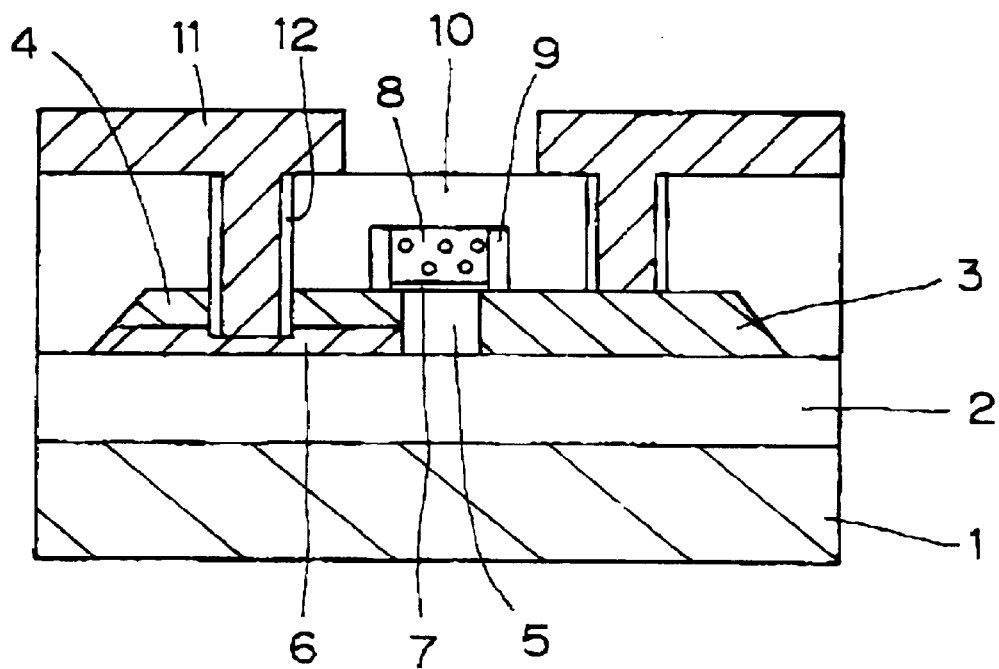

With reference to FIG. 8H, a metal layer such as an aluminum alloy layer is entirely deposited by a sputtering method so that the metal layer extends over the inter-layer insulator 10 and within the body contact holes 15 and the source and drain contact holes 14. As a result, the metal layer is made into contact with the top surfaces of the source and drain regions 4 and 3 and also contact with the intermediate level of the p+-type high impurity concentration region 6. A photo-resist film is formed over the metal layer over the inter-layer insulator 10 by the photo-lithography technique. A dry etching to the metal layer is carried out by use of the photo-resist film as a mask for pattering the metal layer to form metal interconnections 11 extending over the inter-layer insulator 10 as well as form body contact layers within the body contact holes 15 and source and drain contact layers within the source and drain contact holes 14 respectively. The body contact layer is electrically isolated by the body contact hole silicon oxide film 12 from the source region 4. The source and drain regions 4 and 3 are electrically connected through the source and drain contact layers within the source and drain contact holes 14 to the metal interconnections 11. The p+-type high impurity concentration region 6 is also electrically connected through the body contact layer within the body contact hole to the metal interconnections 11.

Second Embodiment

Figure 9:
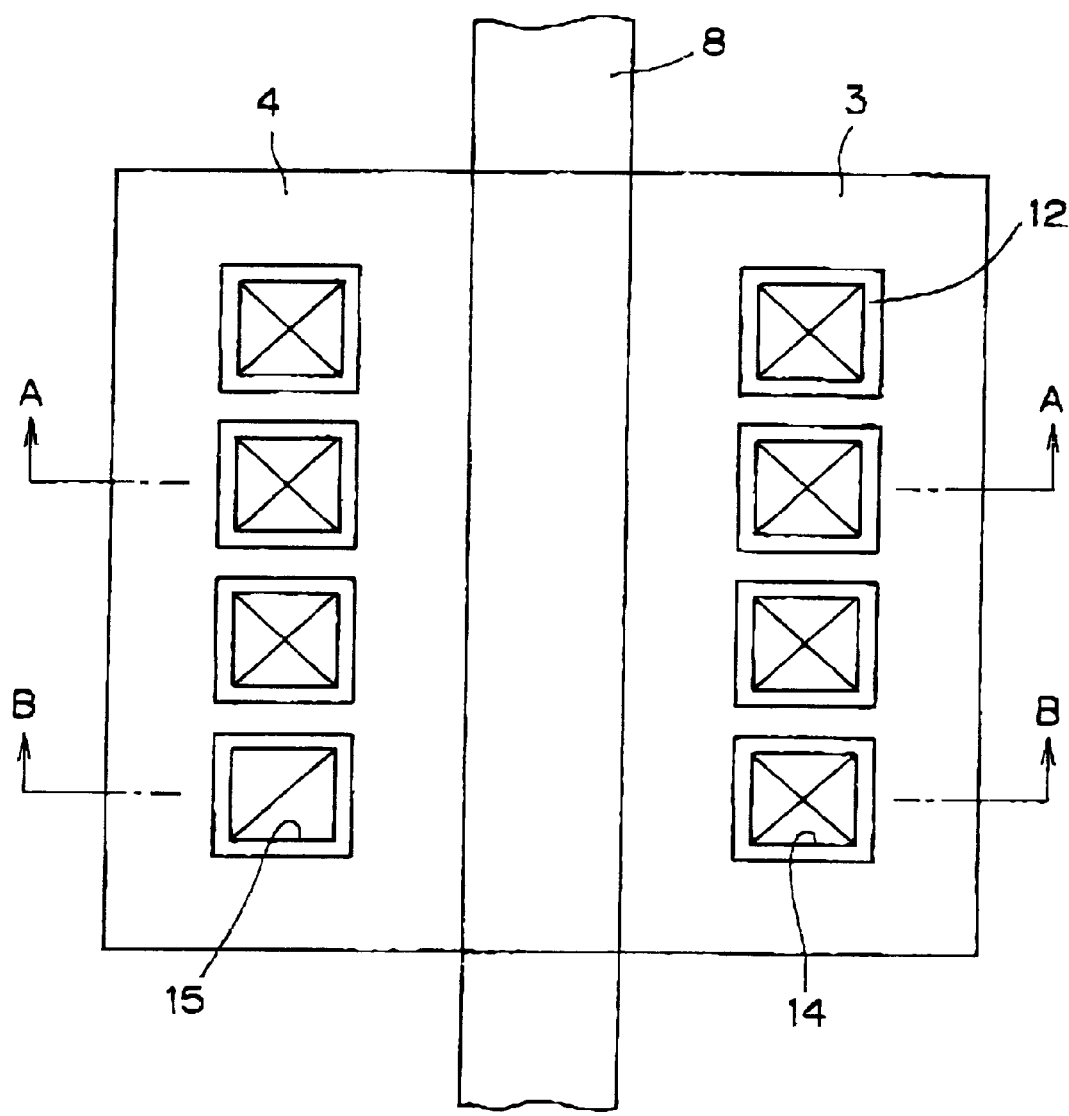
FIG. 9 is a plane view illustrative of a novel SOI-MOS field effect transistor with body contact holes in a second embodiment in accordance with the present invention.
Figure 10A:
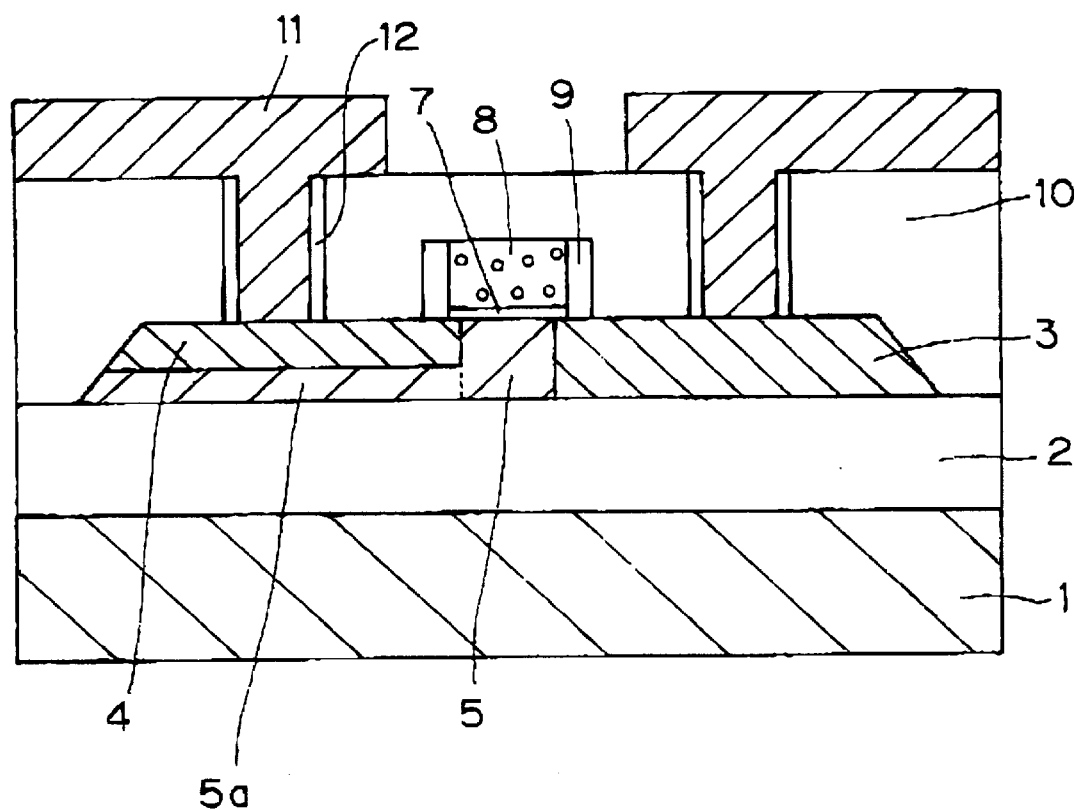
FIG. 10A is a fragmentary cross sectional elevation view illustrative of a novel SOI-MOS field effect transistor with body contact holes taken along 10A—10A line of FIG. 9 in a second embodiment in accordance with the present invention.
Figure 10B:
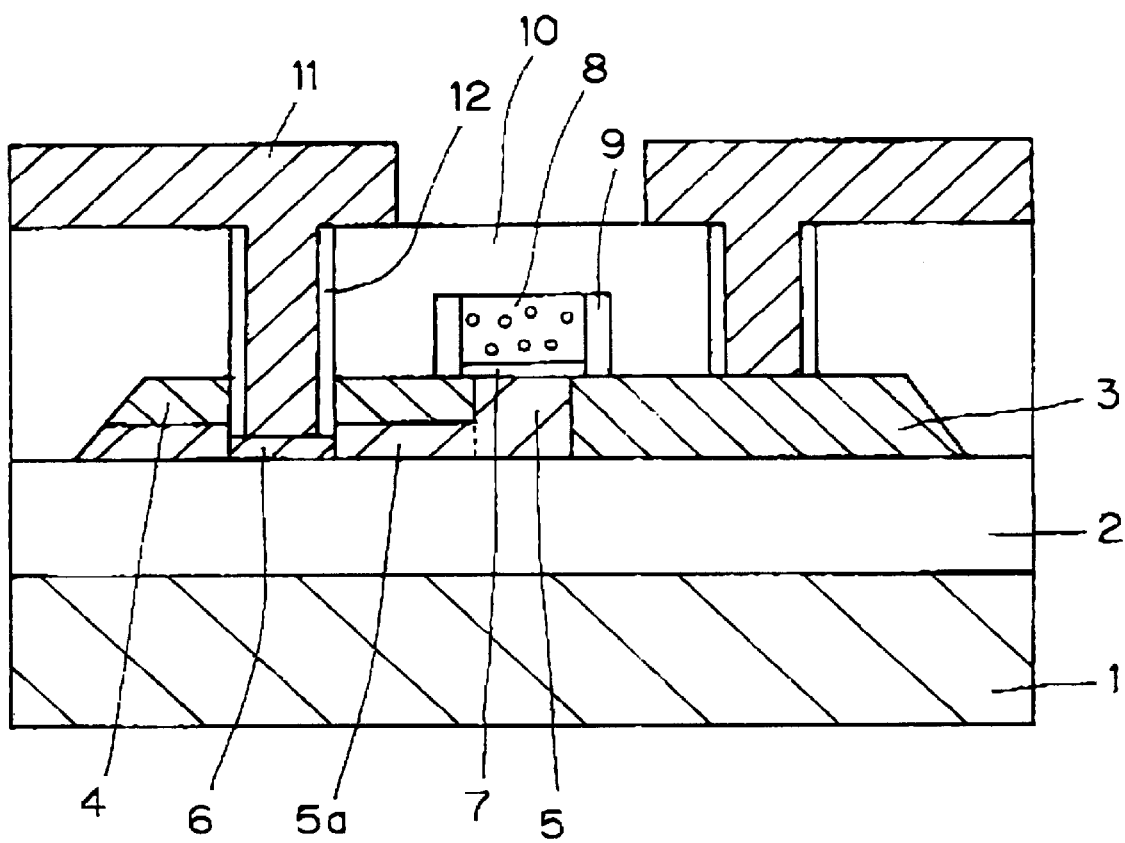
FIG. 10B is a fragmentary cross sectional elevation view illustrative of a novel SOI-MOS field effect transistor with body contact holes taken along a 10B—10B line of FIG. 9 in a second embodiment in accordance with the present invention.

A second embodiment according to the present invention will be described in detail with reference to FIGS. 9, 10A and 10B. A novel SOI-MOS field effect transistor with an improved body contact structure is provided. A buried silicon oxide layer 2 is provided on a silicon substrate 1. A silicon-on-insulator layer made of silicon is selectively provided on the buried silicon oxide layer 2 so that the silicon-on-insulator layer is electrically isolated by the buried silicon oxide layer 2 from the silicon substrate 1. The silicon-on-insulator layer comprises a p--type low impurity concentration region 5a, an n+-type drain region 3, an n+-type source region 4 laminated on the p--type low impurity concentration region 5a and a p--type channel region 5 between the source and drain regions 4 and 3. The drain region 3 is directly contact with the buried silicon oxide layer 2. A gate insulation film 7 is selectively provided on the channel region 5. A gate electrode 8 is provided on the gate insulation film 7. Side wall oxide films 9 are provided on opposite sides of the gate electrode 8. An inter-layer insulator 10 is provided which covers the source and drain regions 4 and 3 and the gate electrode 8 with the side wall oxide films 9. Metal interconnections 11 are provided which extend over the inter-layer insulator 10. Source and drain contact holes 14 are formed in the inter-layer insulator 10 and over the source and drain regions 4 and 3 respectively and under the metal interconnections 11 so that the source and drain contact holes 14 reach the top surface of the source and drain regions 4 and 3 respectively. Further, body contact holes 15 are formed in the inter-layer insulator 10 and over the source region 4 and under the metal interconnection 11 so that the body contact hole 15 penetrates through the 4 source region 4 to reach p+-type high impurity concentration regions 6 formed in the p--type low impurity concentration region 5a. The source contact holes 14 and the body contact holes 15 are alternately aligned in a channel width direction as well illustrated in FIG. 9. Source and drain hole insulation layers 12 are provided on inner walls of the source and drain contact holes 14 respectively. Source and drain contact layers electrically conductive are provided within the source and drain contact holes 14 respectively so that the source and drain contact layers provide electrical connections between the metal interconnection 11 and the source and drain regions 4 and 3. Further the body contact holes 15 have inner walls which are covered by body contact hole insulation films 12. Body contact layers electrically conductive are provided in the body contact holes 15 coated by the body contact hole insulation films 12 so that the body contact layer provides an electrical connection between the p+-type high impurity concentration regions 6 and the metal interconnection 11, whereby a current path is formed from the channel region 5 through the p--type low impurity concentration region 5a, the p+-type high impurity concentration regions 6 and the body contact layer to the metal interconnection 11. The current path allows the holes generated in the channel region 5 to withdraw or discharge through the p--type low impurity concentration region 5a, the p+-type high impurity concentration regions 6 and the body contact layer to the metal interconnection 11.

The body contact hole insulation film 12 electrically isolate the body contact layer from the source region 4 so that no short circuit is formed between the p--type low impurity concentration region 5a and the source region 4. This means that the potentials of the p--type low impurity concentration region 5a and the p+-type high impurity concentration regions 6 are independent from the source potential of the source region 4. The potential of the channel region 5 is not fixed at the same potential as the source potential of the source region 4. The above body contact hole structure makes it possible to control the channel potential of the channel region 5 and the source potential of the source region 4 independently. Namely, the channel potential of the channel region 5 is controllable independently from the control of the source potential of the source region 4. This means that the threshold voltage of the transistor is desirably controllable by controlling the channel potential of the channel region 5.

The above novel body contact hole structure forms the current path for withdrawing and discharging holes from the channel region 5. The current path allows holes generated in the channel region 5 to discharge or withdraw through the p---type low impurity concentration region 5a, the p+type high impurity concentration regions 6, and the body contact layer within the body contact hole 15 to the metal interconnection 11. The above current path allows the transistor to be free from the problems with the kink effects and parasitic bipolar transistor effects.

The above novel body contact hole structure does not require any enlargement in area for providing an additional element, for which reason the above novel body contact hole structure allows realization of high integration of the transistor and a substantive scaling down or size reduction of the transistor.

Further, the above novel body contact hole structure allows the source region to extend almost entirely in an opposite side to the drain region. This means that the source region is allowed to have a sufficiently large width for permitting the transistor to have a sufficiently high driving current.

Furthermore, the drain region is provided in contact directly with the buried silicon oxide layer 2 thereby to form no parasitic capacitance at the p-n junction on the bottom of the drain region. This allows the transistor to exhibit high speed performances.

The following descriptions will focus on the fabrication processes for the above novel SOI-MOS field effect transistor with the improved contact hole structure.

Figure 11A:
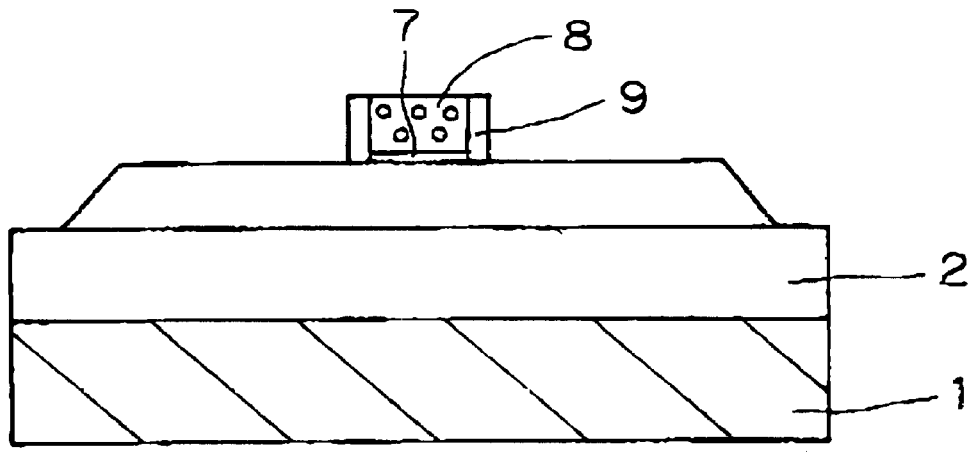
FIGS. 11A through 11I are fragmentary cross sectional elevation views illustrative of novel SOI-MOS field effect transistors with body contact holes in sequential steps involved in a novel method of forming the same in a second embodiment in accordance with the present invention.

With reference to FIG. 11A, a buried silicon oxide layer 2 is formed on a silicon substrate 1. A silicon-on-insulator layer made of silicon is then selectively formed on the buried silicon oxide layer 2 so that the silicon-on-insulator layer has a thickness of 150 nanometers. A mesa type isolation method is carried out. Before or after this mesa type isolation method, an ion-implantation of boron into the silicon-on-insulator layer 5 is carried out so that the silicon-on-insulator layer has an impurity concentration in the order of $10^{-17}$ to $10^{-18}$ cm$^{-3}$ for channel doping thereby to form a p---type low impurity concentration region, a part of which will become a channel region. A thermal oxidation of silicon is carried out to form a gate oxide film 7 having a thickness of 7 nanometers. A low pressure chemical vapor deposition is carried out to deposit a polysilicon film on the gate oxide film 7. An ion-implantation of phosphorus into the polysilicon film is carried out to form a phosphorus highly doped polysilicon film. A photo-resist pattern is formed on the phosphorus highly doped polysilicon film by use of a photo-lithography technique. A dry etching process is then carried out for patterning the phosphorus highly doped polysilicon film thereby to form a gate electrode 8 over the gate oxide film 7. A chemical vapor deposition is carried out to entirely deposit a silicon oxide film having a thickness of 100 nanometers which covers the gate electrode 8 and the silicon-on-insulator layer 5 for subsequent etch back process to the silicon oxide film to selectively leave the silicon oxide film only on opposite side walls of the gate electrode 8, whereby side wall oxide films 9 are formed on the opposite side walls of the gate electrode 8.

Figure 11B:
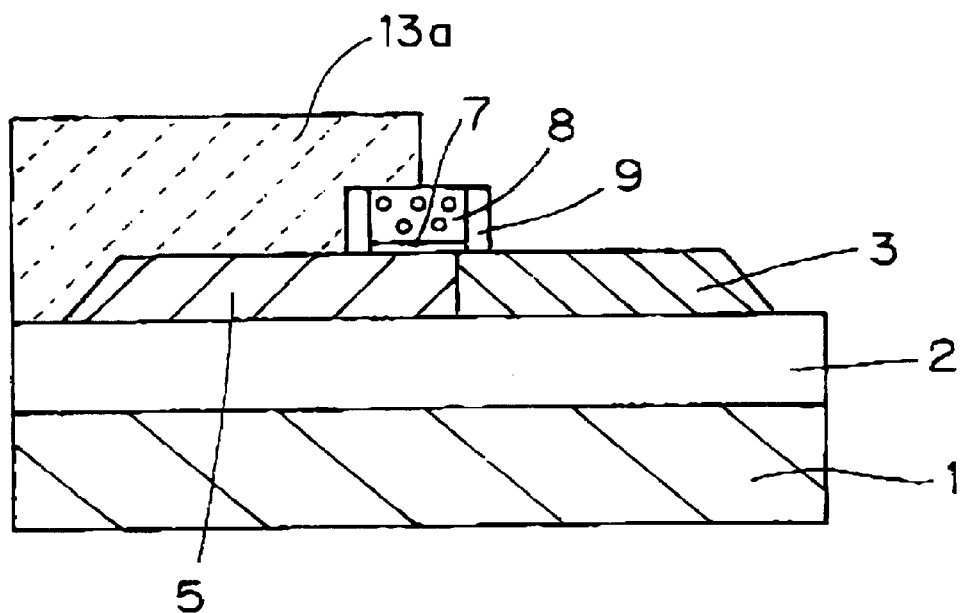

With reference to FIG. 11B, a photo-resist film 13a is formed by a photo-lithography technique so that the photo-resist film 13a extends over a source formation region of the silicon-on-insulator layer 5 and a part of the gate electrode 8. An ion-implantation of arsenic into the source formation region of the silicon-on-insulator layer 5 is carried out by use of the photo-resist film 13a as a mask at an ion-implantation energy of 80 keV and such a dose that the drain formation region of the silicon-on-insulator layer 5 has an impurity concentration of about $5 \times 10^{20}$ cm$^{-3}$ whereby a drain region 3 is formed in the silicon-on-insulator layer 5.

Figure 11C:
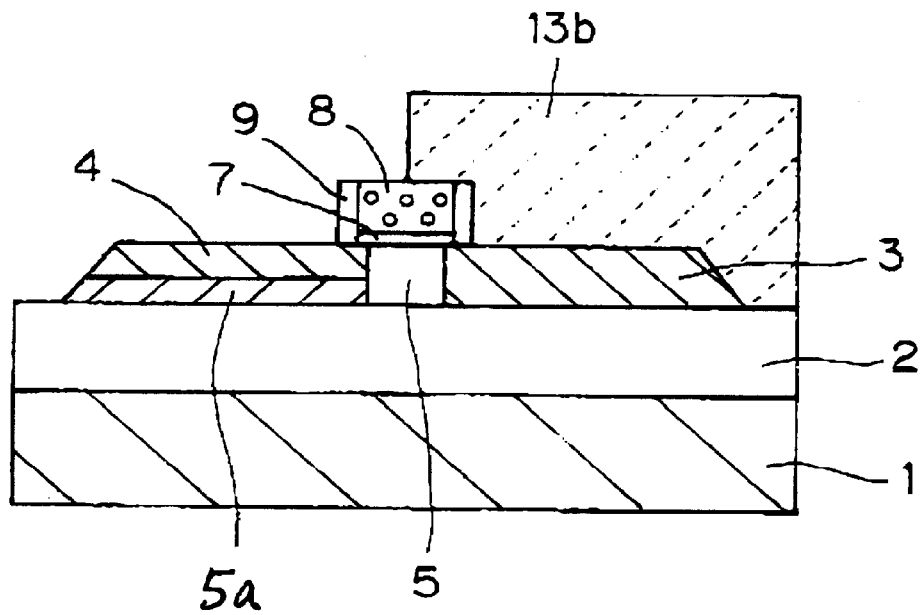

With reference to FIG. 11C, the used photo-resist film 13a is removed. Thereafter, another photo-resist film 13b is selectively formed by a photo-lithography technique so that the photo-resist film 13b extends over the drain region 3 and another part of the gate electrode 8. An ion-implantation of arsenic into an upper half region of the source formation region of the silicon-on-insulator layer 5 is carried out by use of the photo-resist film 13b as a mask at an ion-implantation energy of 30 keV and such a dose that the upper half region of the source formation region of the silicon-on-insulator layer 5 has an impurity concentration of about $5 \times 10^{20}$ cm$^{-3}$ whereby a source region 4 is formed in the upper half region of the source formation region of the silicon-on-insulator layer 5. As a result, the low half part of the source formation region of the silicon-on-insulator layer is defined to be a p---type low impurity concentration region 5a, wherein the silicon-on-insulator layer 5 had previously been doped with boron in the first process shown in FIG. 11A, for which reason the p---type low impurity concentration region 5a has the same impurity concentration as that of the channel region 5.

Figure 11D:
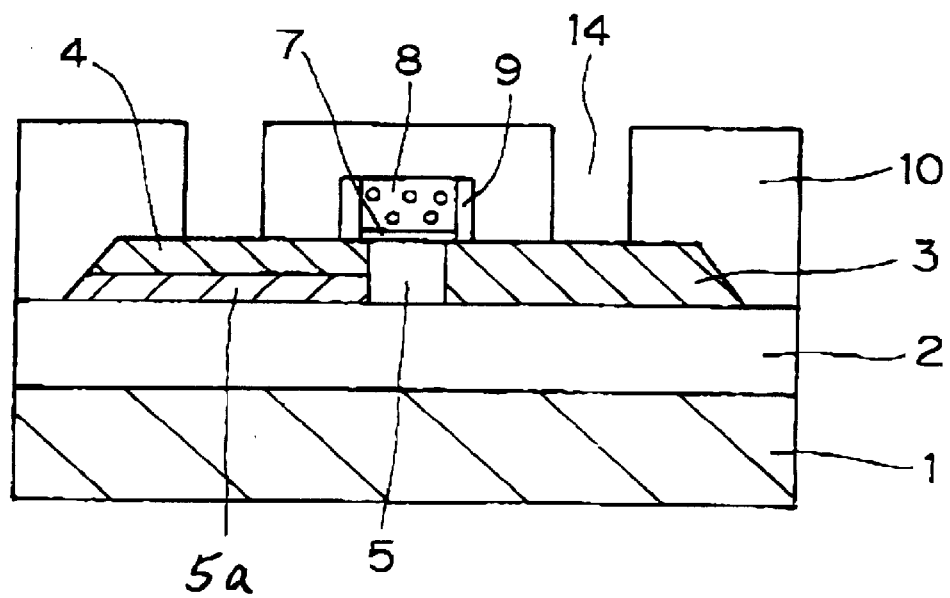

With reference to FIG. 11D, the used pboto-resist film 13b is removed. Thereafter, a rapid thermal anneal is carried out at a temperature of about 1000° C. for 10 seconds for causing activations of the impurities of boron and arsenic. A chemical vapor deposition is carried out to entirely deposit an inter-layer insulator 10 made of boro-phospho silicate glass so that the inter-layer insulator 10 covers the source and drain regions 4 and 3 and the gate electrode 8 as well as the side wall oxide films 9 and the buried silicon oxide layer 2. The deposited inter-layer insulator 10 is then planarized by reflow process. A photo-resist film is formed over the inter-layer insulator 10 by use of the photo-lithography technique. A dry etching process to the inter-layer insulator 10 is carried out by use of the photo-resist film as a mask to form contact holes 14 in the inter-layer insulator 10 so that the contact holes 14 just reach the top surfaces of the source region 4 and the drain region 3. Namely, the top surfaces of the source region 4 and the drain region 3 are partially shown through the contact holes 14. The used photo-resist film is then removed.

Figure 11E:
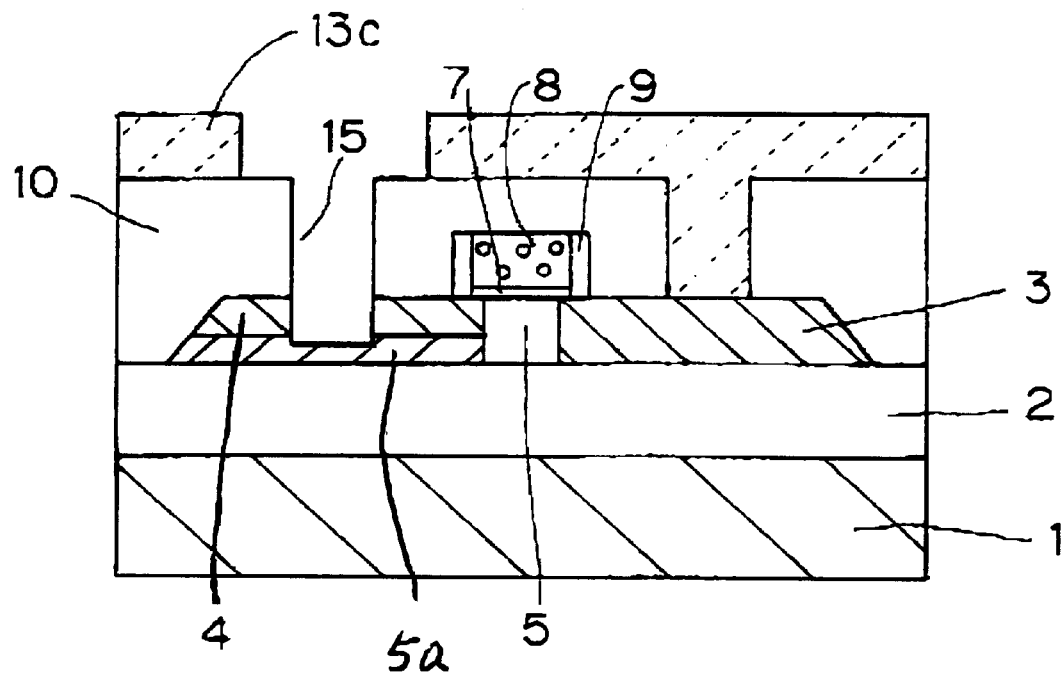

With reference to FIG. 11E, a photo-resist film 13c is formed over the inter-layer insulator 10 by the photo-lithography technique so that the photo-resist film 13c has openings which are positioned alternately over the holes 14 formed over the source region 4. An anisotropic etching to the source region 4 and the p---type low impurity concentration region 5a is carried out to the source contact holes 14 alternatively under the openings of the photo-resist film 13c so as to further extend downwardly so as to form body contact holes 15 which penetrate through the source region 4 to reach an intermediate level of the p---type low impurity concentration region 5a. The body contact holes 15 and the source contact holes 14 are aligned alternately over the source region 4, wherein the body contact holes 15 penetrate through the source region 4 to reach the intermediate level of the p---type low impurity concentration region 5a whilst the source contact holes 14 just reach the top surface of the source region 4. The drain contact holes 14 also just reach the top surface of the drain region 3.

Figure 11F:
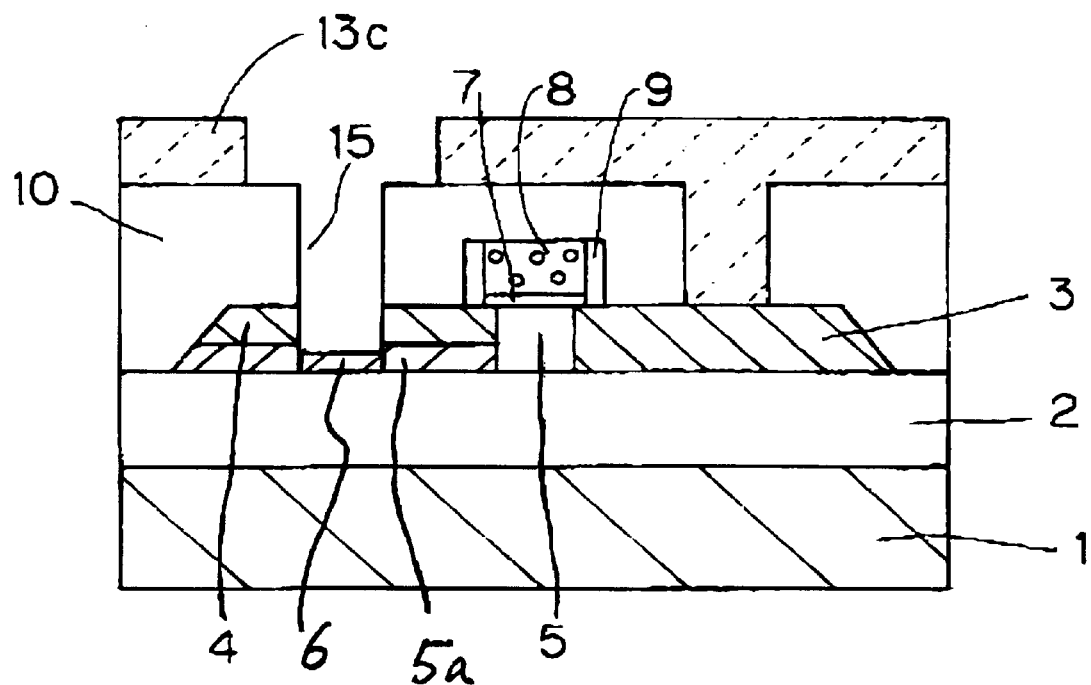

With reference to FIG. 11F, subsequently an ion-implantation of boron into the p---type low impurity concentration region 5a is carried out by use of the above photo-resist film 13c as a mask to form p+-type high impurity concentration regions 6 under the body contact holes 15. The used photo-resist film 13c is removed.

Figure 11G:
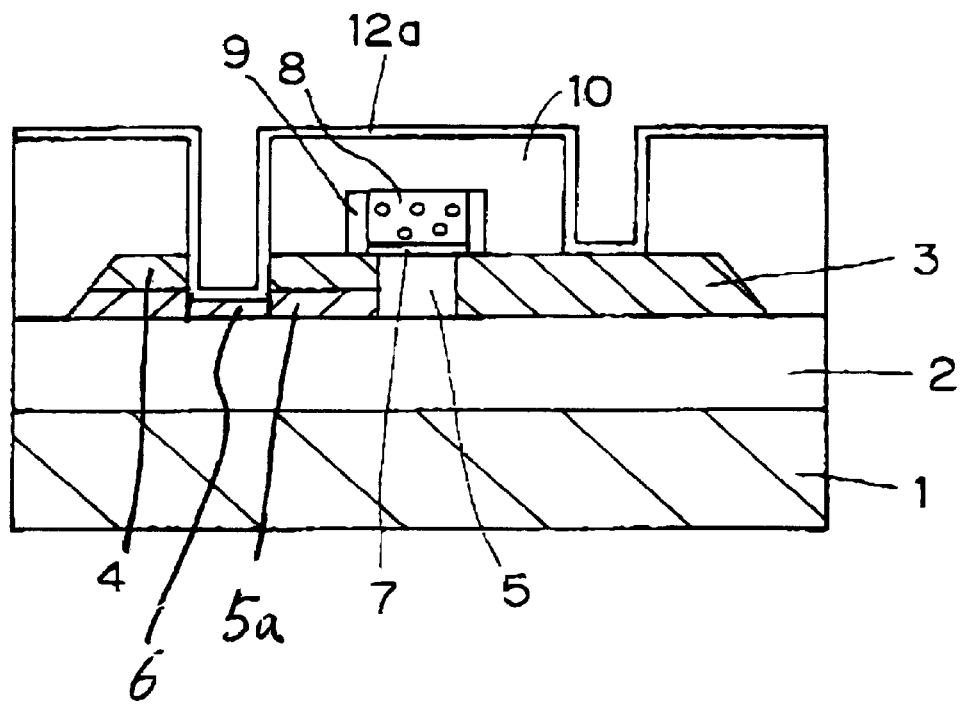

With reference to FIG. 11G, a chemical vapor deposition is carried out to entirely deposit a silicon oxide film 12a which covers the top surface of the inter-layer insulator 10 and side walls and bottoms of each of the body contact holes 15 and the source and drain contact holes 14. The silicon oxide film 12a has a thickness of about 20 nanometers.

Figure 11H:
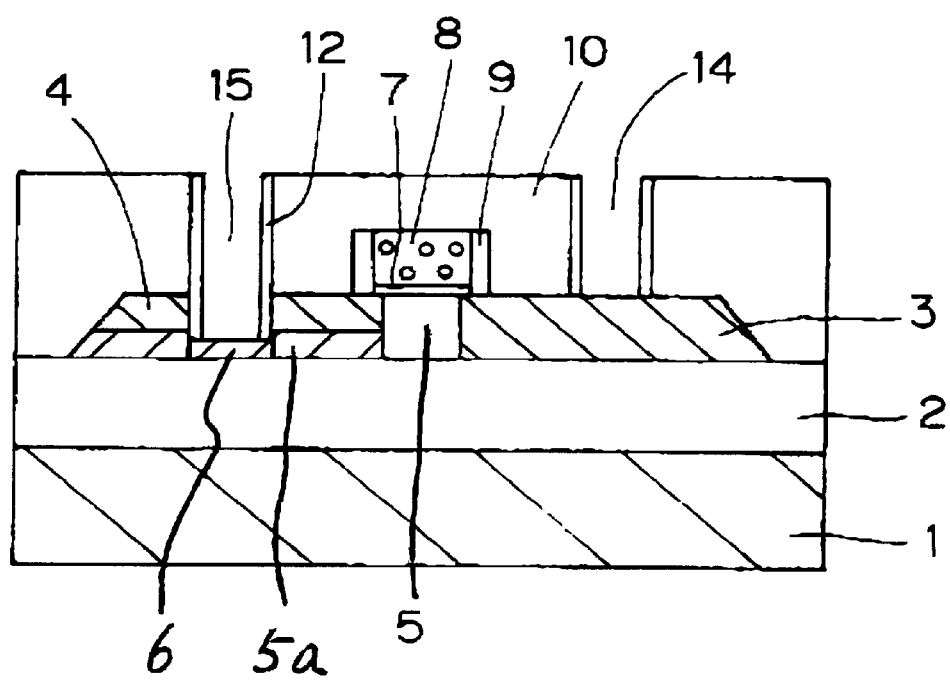

With reference to FIG. 11H, an anisotropic etching to the silicon oxide film 12a is carried out so that the silicon oxide film 12a remains only on the inner walls of each of the body contact holes 15 and the source and drain contact holes 14 whereby body contact hole silicon oxide films 12 are formed on the inner walls of the body contact holes 15 and the source/drain contact hole silicon oxide films 12 are also formed on the inner walls of the source and drain contact holes 14. As a result, the top surfaces of the source and drain regions 4 and 3 are shown through the source and drain contact holes 14 having the inner walls covered by the silicon oxide films 12 whilst the p+-type high impurity concentration region 6 is shown through the body contact holes 15.

Figure 11I:
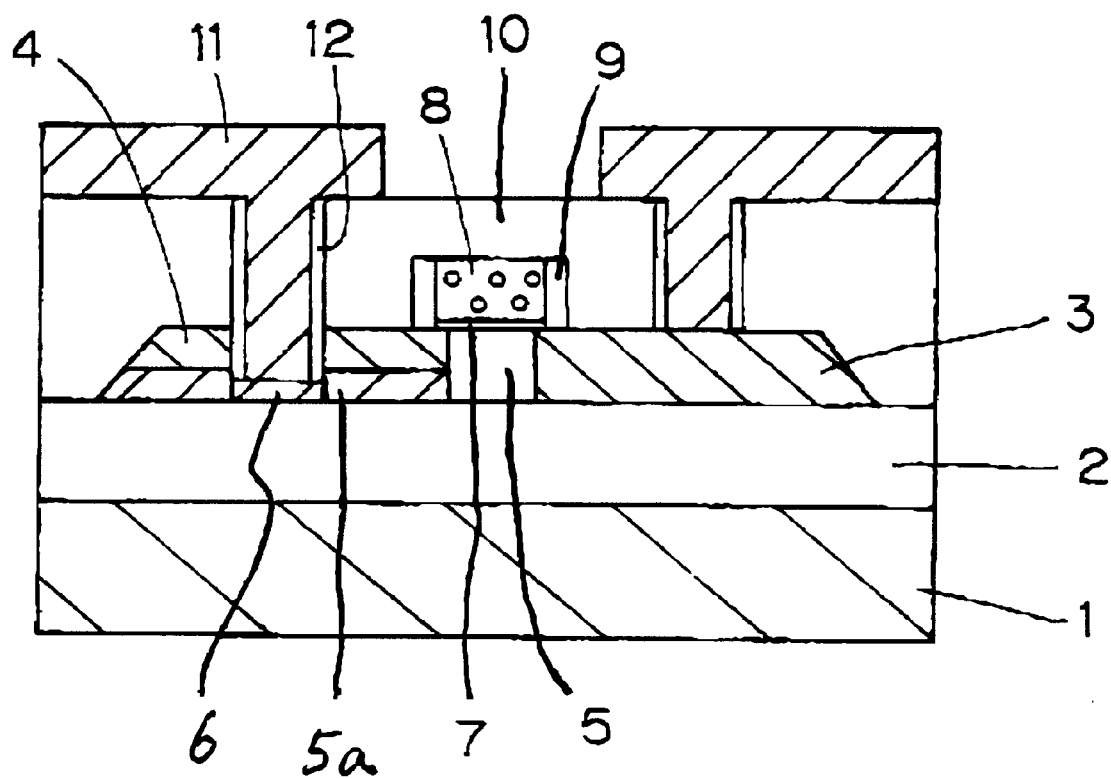

With reference to FIG. 11I, a metal layer such as an aluminum alloy layer is entirely deposited by a sputtering method so that the metal layer extends over the inter-layer insulator 10 and within the body contact holes 15 and the source and drain contact holes 14. As a result, the metal layer is made into contact with the top surfaces of the source and drain regions 4 and 3 and also contact with the top surface of the p+-type high impurity concentration region 6. A photo-resist film is formed over the metal layer over the inter-layer insulator 10 by the photo-lithography technique. A dry etching to the metal layer is carried out by use of the photo-resist film as a mask for pattering the metal layer to form metal interconnections 11 extending over the inter-layer insulator 10 as well as form body contact layers within the body contact holes 15 and source and drain contact layers within the source and drain contact holes 14 respectively. The body contact layer is electrically isolated by the body contact hole silicon oxide film 12 from the source region 4. The source and drain regions 4 and 3 are electrically connected through the source and drain contact layers within the source and drain contact holes 14 to the metal interconnections 11. The p+-type high impurity concentration region 6 is also electrically connected through the body contact layer within the body contact hole to the metal interconnections 11.

Third Embodiment

A third embodiment according to the present invention will be described. A novel SOI-MOS field effect transistor with an improved body contact structure is provided. The novel SOI-MOS field effect transistor of this embodiment is the same in the structure and effects as in the second embodiment whereas fabrication processes for the novel SOI-MOS field effect transistor in this embodiment are different from those in the second embodiment. For those reasons, the following descriptions will focus onto the fabrication processes for the novel SOI-MOS field effect transistor.

Figure 12A:
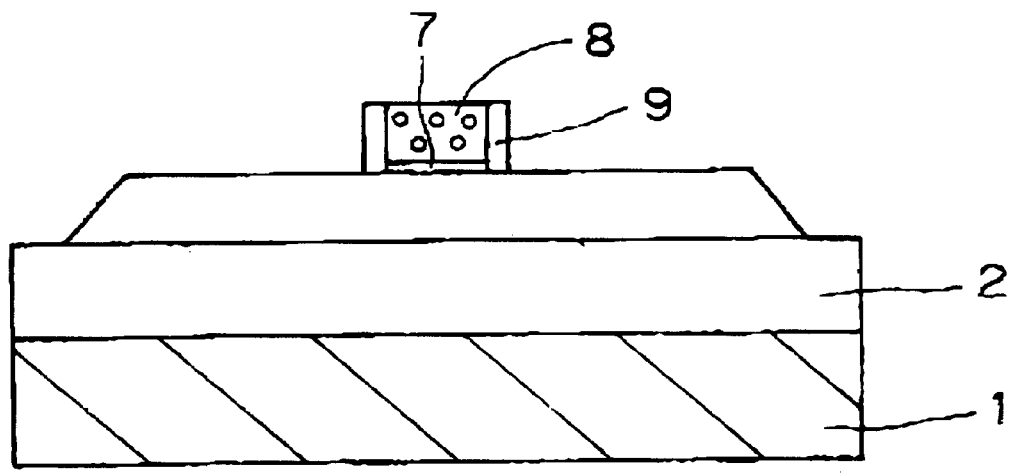
FIGS. 12A through 12I are fragmentary cross sectional elevation views illustrative of novel SOI-MOS field effect transistors with body contact holes in sequential steps involved in a novel method of forming the same in a third embodiment in accordance with the present invention.

With reference to FIG. 12A, a buried silicon oxide layer 2 is formed on a silicon substrate 1. A silicon-on-insulator layer made of silicon is then selectively formed on the buried silicon oxide layer 2 so that the silicon-on-insulator layer has a thickness of 150 nanometers. A mesa type isolation method is carried out. Before or after this mesa type isolation method, an ion-implantation of boron into the silicon-on-insulator layer 5 is carried out so that the silicon-on-insulator layer has an impurity concentration in the order of $10^{-17}$ to $10^{-18}$ cm$^{-3}$ for channel doping thereby to form a p--type low impurity concentration region, a part of which will become a channel region. A thermal oxidation of silicon is carried out to form a gate oxide film 7 having a thickness of 7 nanometers. A low pressure chemical vapor deposition is carried out to deposit a polysilicon film on the gate oxide film 7. An ion-implantation of phosphorus into the polysilicon film is carried out to form a phosphorus highly doped polysilicon film. A photo-resist pattern is formed on the phosphorus highly doped polysilicon film by use of a photo-lithography technique. A dry etching process is then carried out for patterning the phosphorus highly doped polysilicon film thereby to form a gate electrode 8 over the gate oxide film 7. A chemical vapor deposition is carried out to entirely deposit a silicon oxide film having a thickness of 100 nanometers which covers the gate electrode 8 and the silicon-on-insulator layer 5 for subsequent etch back process to the silicon oxide film to selectively leave the silicon oxide film only on opposite side walls of the gate electrode 8, whereby side wall oxide films 9 are formed on the opposite side walls of the gate electrode 8.

Figure 12B:
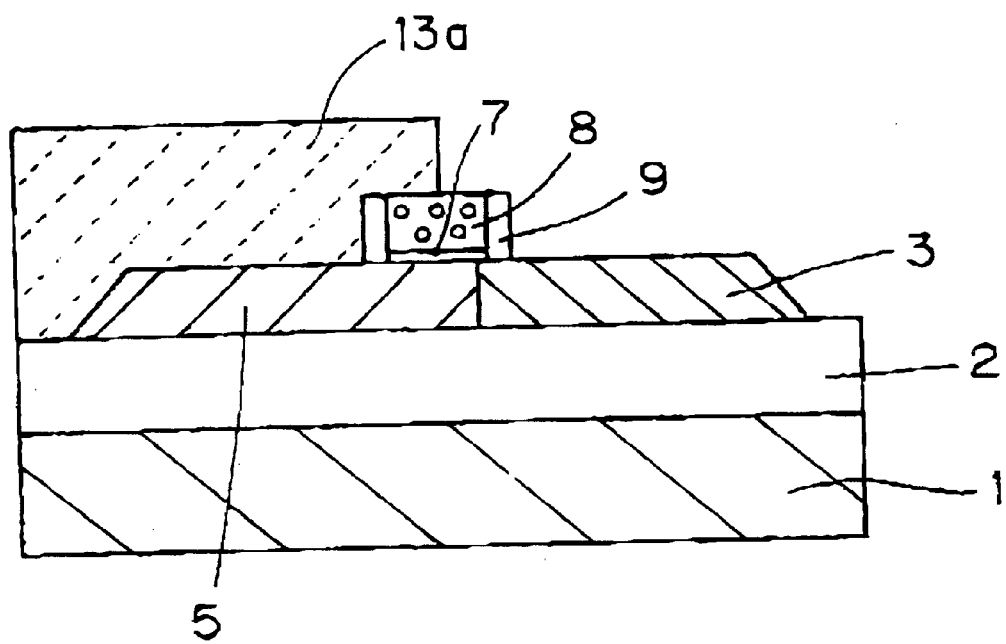

With reference to FIG. 12B, a pboto-resist film 13a is formed by a photo-lithography technique so that the photo-resist film 13a extends over a source formation region of the silicon-on-insulator layer 5 and a part of the gate electrode 8. An ion-implantation of arsenic into the source formation region of the silicon-on-insulator layer 5 is carried out by use of the photo-resist film 13a as a mask at an ion-implantation energy of 80 keV and such a dose that the drain formation region of the silicon-on-insulator layer 5 has an impurity concentration of about $5 \times 10^{20}$ cm$^{-3}$ whereby a drain region 3 is formed in the silicon-on-insulator layer 5.

Figure 12C:
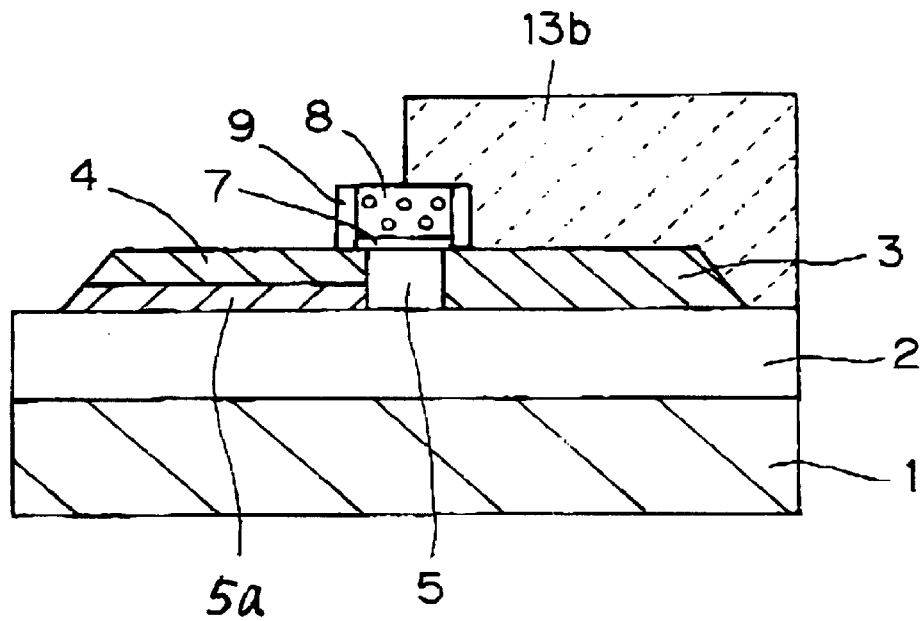

With reference to FIG. 12C, the used photo-resist film 13a is removed. Thereafter, another photo-resist film 13b is selectively formed by a photo-lithography technique so that the photo-resist film 13b extends over the drain region 3 and another part of the gate electrode 8. An ion-implantation of arsenic into an upper half region of the source formation region of the silicon-on-insulator layer 5 is carried out by use of the photo-resist film 13b as a mask at an ion-implantation energy of 30 keV and such a dose that the upper half region of the source formation region of the silicon-on-insulator layer 5 has an impurity concentration of about $5 \times 10^{20}$ cm$^{-3}$ whereby a source region 4 is formed in the upper half region of the source formation region of the silicon-on-insulator layer 5. As a result, the low half part of the source formation region of the silicon-on-insulator layer is defined to be a p--type low impurity concentration region 5a, wherein the silicon-on-insulator layer 5 had previously been doped with boron in the first process shown in FIG. 12A, for which reason the p--type low impurity concentration region 5a has the same impurity concentration as that of the channel region 5.

Figure 12D:
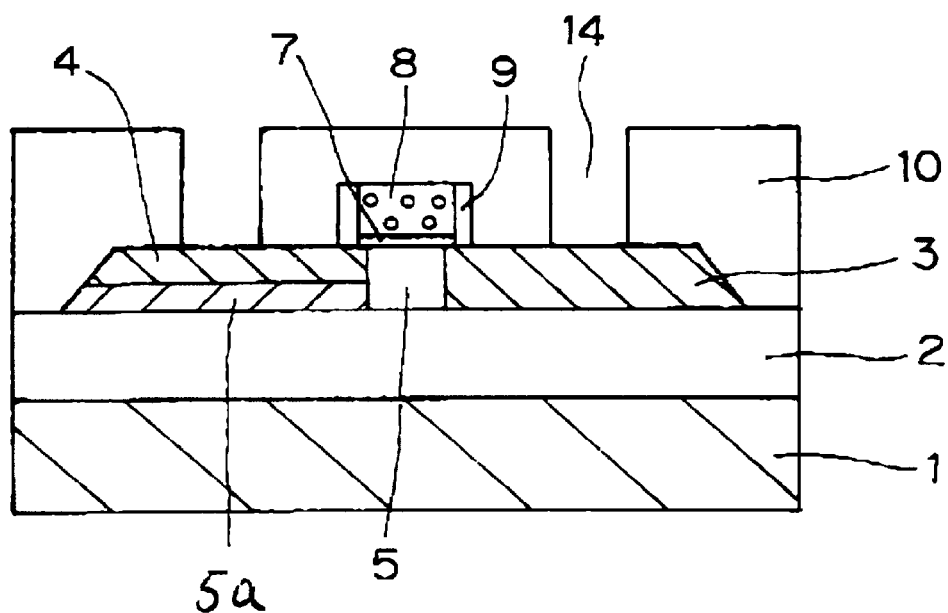

With reference to FIG. 12D, the used photo-resist film 13b is removed. Thereafter, a rapid thermal anneal is carried out at a temperature of about 1000° C. for 10 seconds for causing activations of the impurities of boron and arsenic. A chemical vapor deposition is carried out to entirely deposit an inter-layer insulator 10 made of boro-phospho silicate glass so that the inter-layer insulator 10 covers the source and drain regions 4 and 3 and the gate electrode 8 as well as the side wall oxide films 9 and the buried silicon oxide layer 2. The deposited inter-layer insulator 10 is then planarized by reflow process. A photo-resist film is formed over the inter-layer insulator 10 by use of the photo-lithography technique. A dry etching process to the inter-layer insulator 10 is carried out by use of the photo-resist film as a mask to form contact holes 14 in the inter-layer insulator 10 so that the contact holes 14 just reach the top surfaces of the source region 4 and the drain region 3. Namely, the top surfaces of the source region 4 and the drain region 3 are partially shown through the contact holes 14. The used photo-resist film is then removed.

Figure 12E:
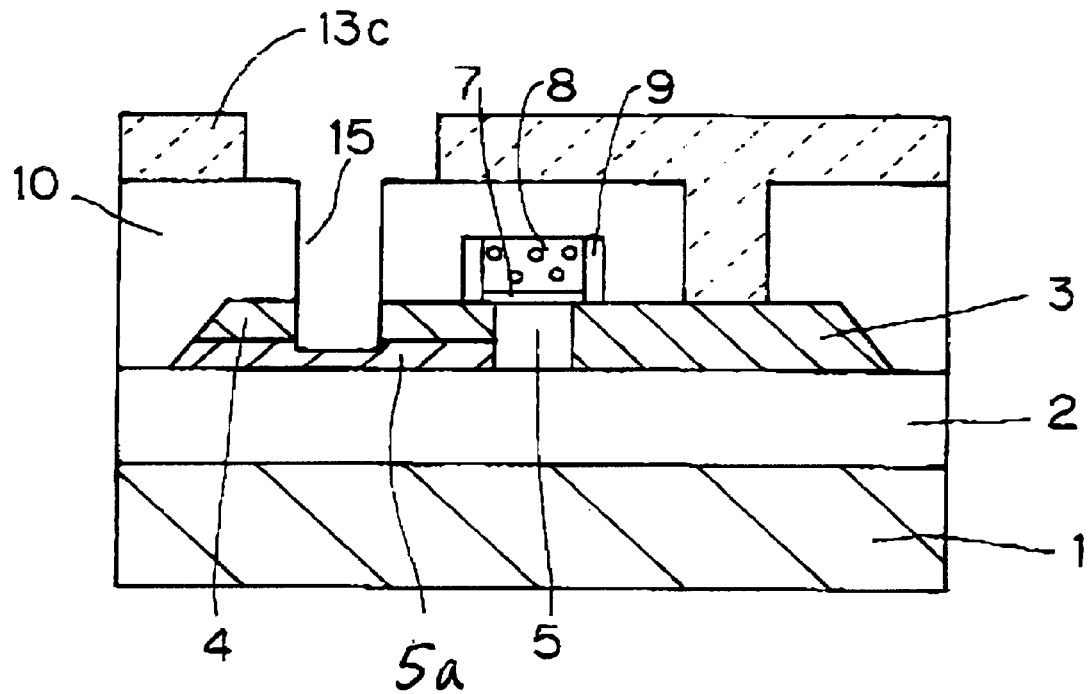

With reference to FIG. 12E, a photo-resist film 13c is formed over the inter-layer insulator 10 by the photo-lithography technique so that the photo-resist film 13c has openings which are positioned alternately over the holes 14 formed over the source region 4. An anisotropic etching to the source region 4 and the p--type low impurity concentration region 5a is carried out to the source contact holes 14 alternatively under the openings of the photo-resist film 13c so as to further extend downwardly so as to form body contact holes 15 which penetrate through the source region 4 to reach an intermediate level of the p--type low impurity concentration region 5a. The body contact holes 15 and the source contact holes 14 are aligned alternately over the source region 4, wherein the body contact holes 15 penetrate through the source region 4 to reach the intermediate level of the p--type low impurity concentration region 5a whilst the source contact holes 14 just reach the top surface of the source region 4. The drain contact holes 14 also just reach the top surface of the drain region 3. The used photo-resist film 13c is removed.

Figure 12F:
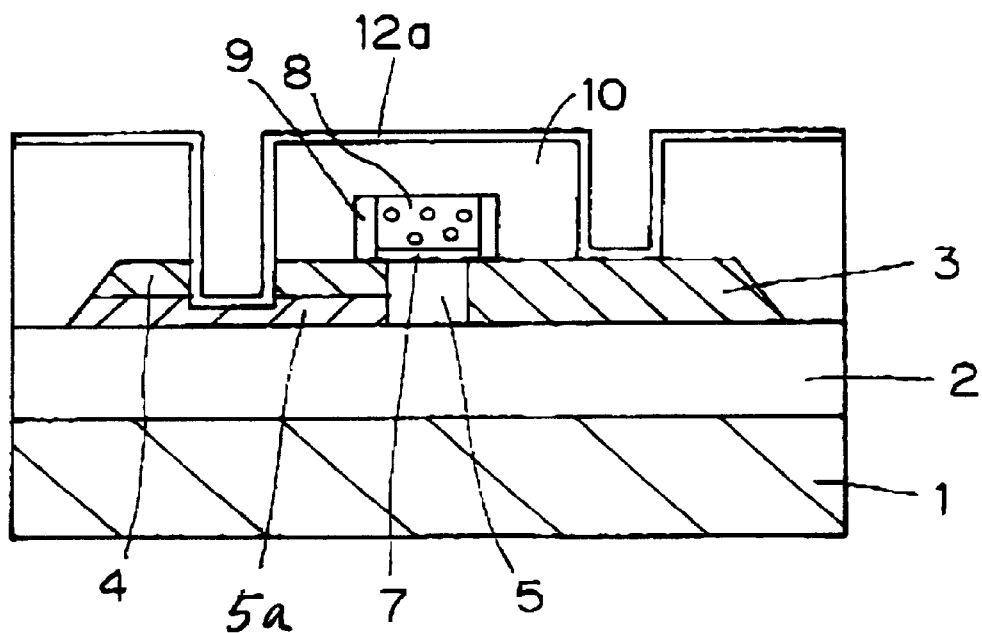

With reference to FIG. 12F, a chemical vapor deposition is carried out to entirely deposit a silicon oxide film 12a which covers the top surface of the inter-layer insulator 10 and side walls and bottoms of each of the body contact holes 15 and the source and drain contact holes 14. The silicon oxide film 12a has a thickness of about 20 nanometers.

Figure 12G:
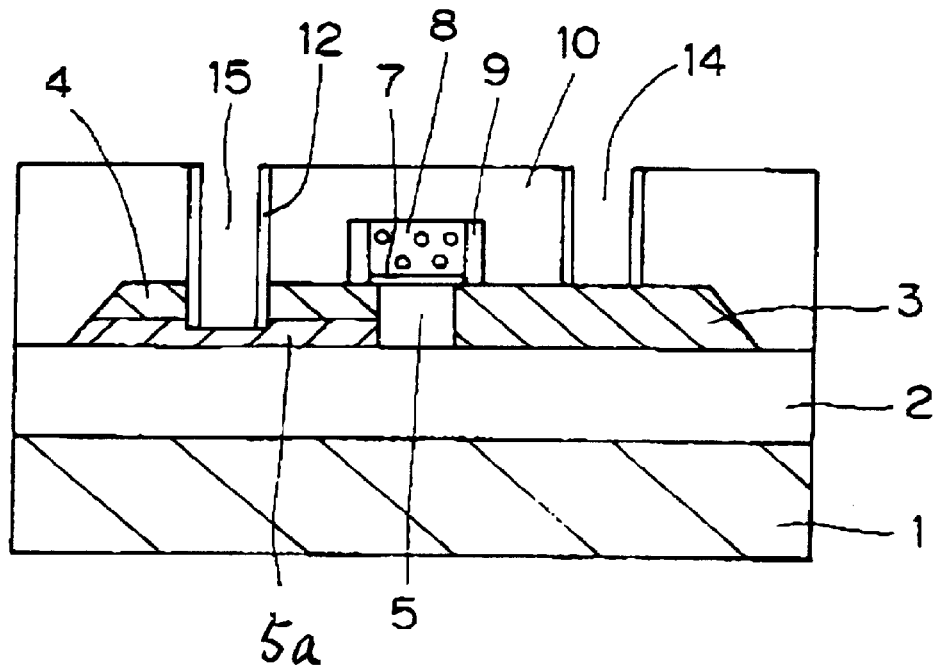

With reference to FIG. 12G, an anisotropic etching to the silicon oxide film 12a is carried out so that the silicon oxide film 12a remains only on the inner walls of each of the body contact holes 15 and the source and drain contact holes 14 whereby body contact hole silicon oxide films 12 are formed on the inner walls of the body contact holes 15 and the source/drain contact hole silicon oxide films 12 are also formed on the inner walls of the source and drain contact holes 14. As a result, the top surfaces of the source and drain regions 4 and 3 are shown through the source and drain contact holes 14 having the inner walls covered by the silicon oxide films 12 whilst the p--type low impurity concentration region 5a is shown through the body contact holes 15.

Figure 12H:
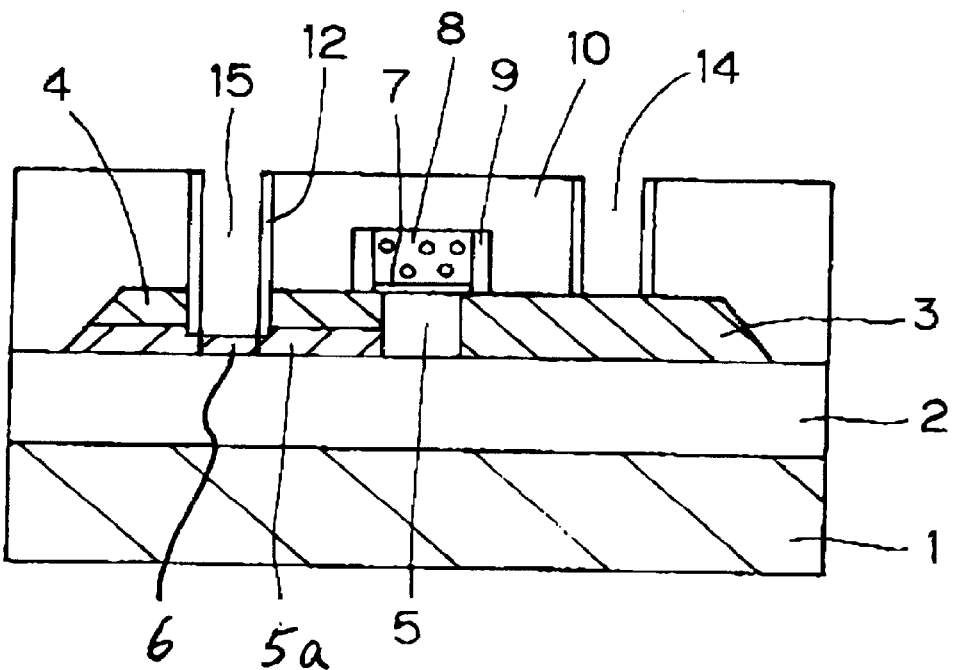

With reference to FIG. 12H, a photo-resist film is formed over the inter-layer insulator 10 by the photo-lithography technique so that the photo-resist film has openings which are positioned alternately over the holes 14 formed over the source region 4. Subsequently, an ion-implantation of boron into the p--type low impurity concentration region 5a is carried out by use of the above photo-resist film 13c as a mask to form p+-type high impurity concentration regions 6 under the body contact holes 15. The used photo-resist film is removed.

Figure 12I:
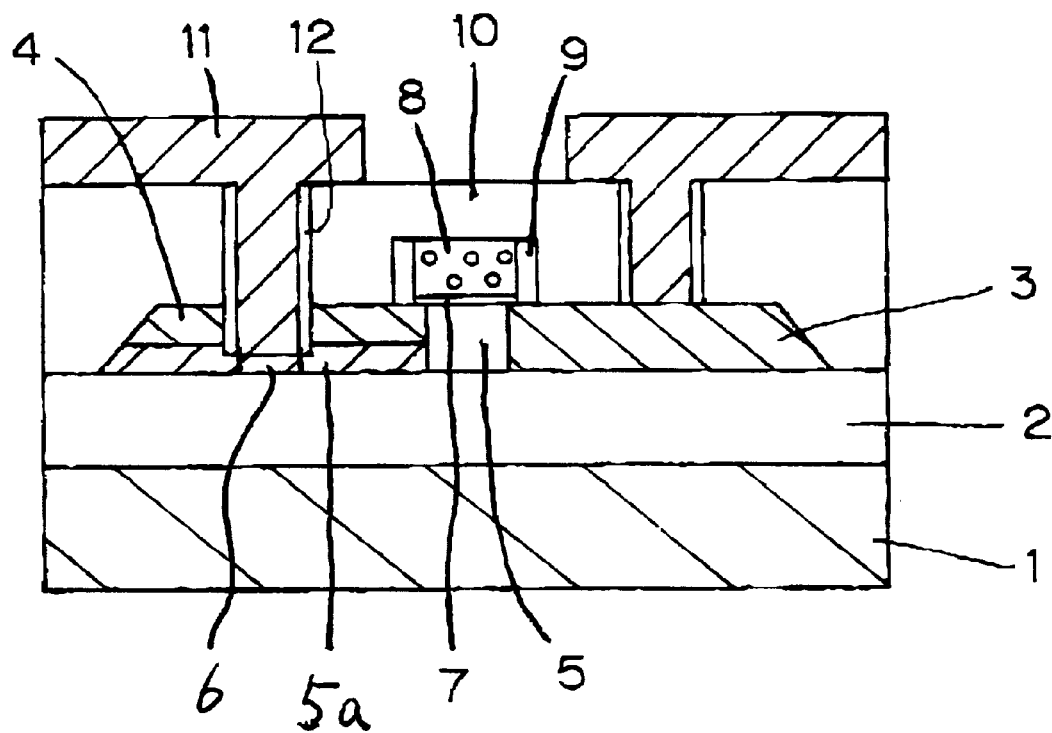

With reference to FIG. 12I, a metal layer such as an aluminum alloy layer is entirely deposited by a sputtering method so that the metal layer extends over the inter-layer insulator 10 and within the body contact holes 15 and the source and drain contact holes 14. As a result, the metal layer is made into contact with the top surfaces of the source and drain regions 4 and 3 and also contact with the top surface of the p+-type high impurity concentration region 6. A photo-resist film is formed over the metal layer over the inter-layer insulator 10 by the photo-lithography technique. A dry etching to the metal layer is carried out by use of the photo-resist film as a mask for pattering the metal layer to form metal interconnections 11 extending over the inter-layer insulator 10 as well as form body contact layers within the body contact holes 15 and source and drain contact layers within the source and drain contact holes 14 respectively. The body contact layer is electrically isolated by the body contact hole silicon oxide film 12 from the source region 4. The source and drain regions 4 and 3 are electrically connected through the source and drain contact layers within the source and drain contact holes 14 to the metal interconnections 11. The p+-type high impurity concentration region 6 is also electrically connected through the body contact layer within the body contact hole to the metal interconnections 11.

Fourth Embodiment

Figure 13:
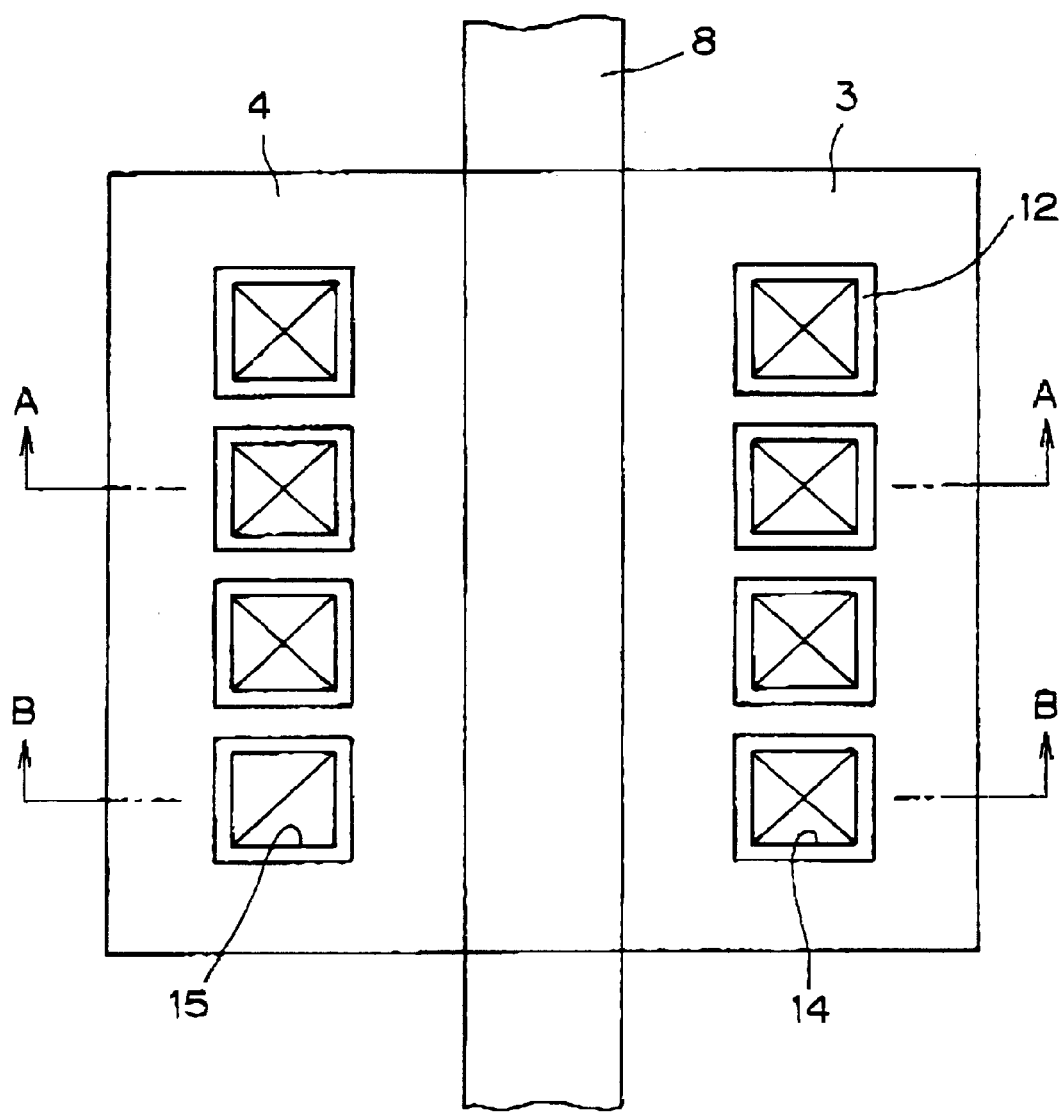
FIG. 13 is a plane view illustrative of a novel SOI-MOS field effect transistor with body contact holes in a fourth embodiment in accordance with the present invention.
Figure 14A:
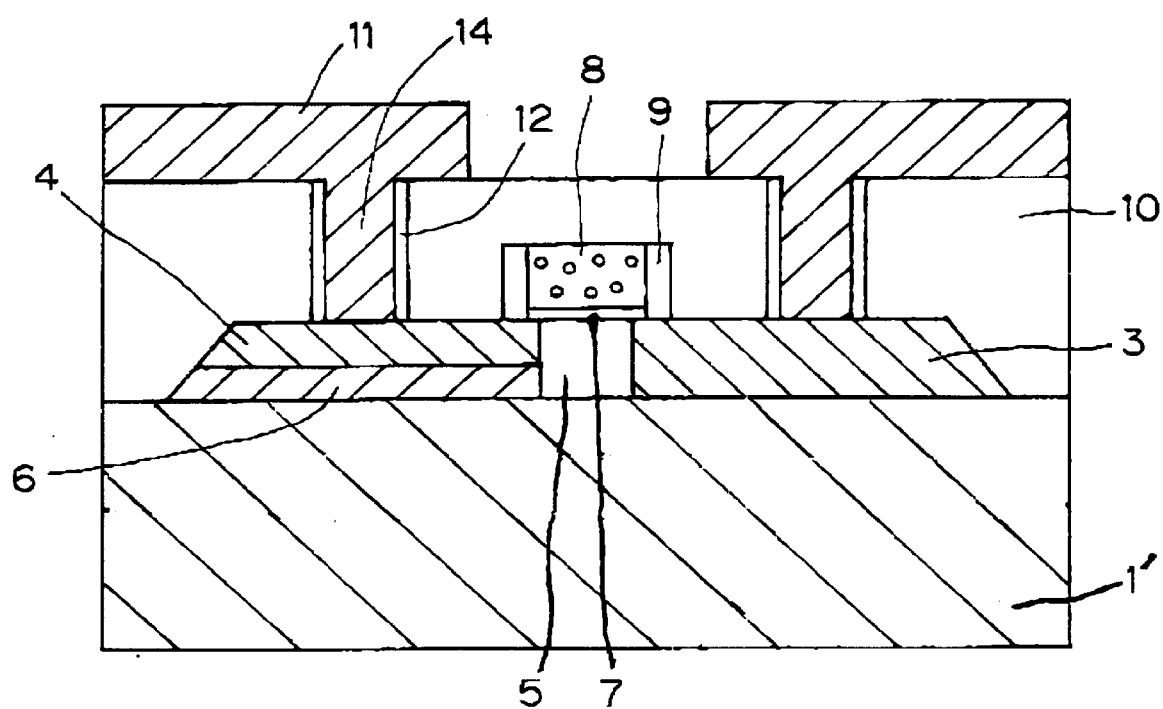
FIG. 14A is fragmentary cross sectional elevation view illustrative of a novel SOI-MOS field effect transistor with body contact holes taken along an 14A—14A line of FIG. 13 in a fourth embodiment in accordance with the present invention.
Figure 14B:
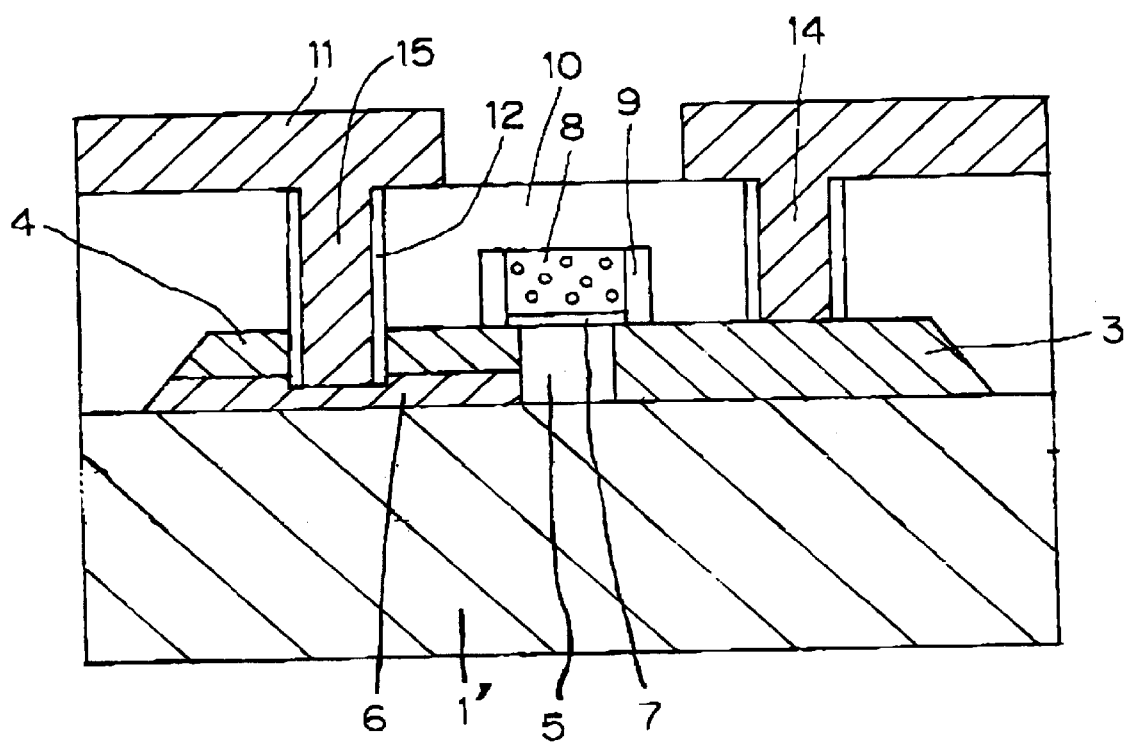
FIG. 14B is fragmentary cross sectional elevation view illustrative of a novel SOI-MOS field effect transistor with body contact holes taken along a 14B—14B line of FIG. 13 in a fourth embodiment in accordance with the present invention.

A fourth embodiment according to the present invention will be described in detail with reference to FIGS. 13, 14A and 14B. A novel SOS-MOS field effect transistor with an improved body contact structure is provided. A silicon-on-substrate layer made of silicon is selectively provided on an insulating substrate 1'. The silicon-on-substrate layer comprises a p+-type high impurity concentration region 6, an n+-type drain region 3, an n+-type source region 4 laminated on the p+-type high impurity concentration region 6 and a p--type channel region 5 between the source and drain regions 4 and 3. The drain region 3 is directly contact with the insulating substrate 1'. A gate insulation film 7 is selectively provided on the channel region 5. A gate electrode 8 is provided on the gate insulation film 7. Side wall oxide films 9 are provided on opposite sides of the gate electrode 8. An inter-layer insulator 10 is provided which covers the source and drain regions 4 and 3 and the gate electrode 8 with the side wall oxide films 9. Metal interconnections 11 are provided which extend over the inter-layer insulator 10. Source and drain contact holes 14 are formed in the inter-layer insulator 10 and over the source and drain regions 4 and 3 respectively and under the metal interconnections 11 so that the source and drain contact holes 14 reach the top surface of the source and drain regions 4 and 3 respectively. Further, body contact holes 15 are formed in the inter-layer insulator 10 and over the source region 4 and under the metal interconnection 11 so that the body contact hole 15 penetrates through the source region 4 to reach the p+-type high impurity concentration region 6. The source contact holes 14 and the body contact holes 15 are alternately aligned in a channel width direction as well illustrated in FIG. 13. Source and drain hole insulation layers 12 are provided on inner walls of the source and drain contact holes 14 respectively. Source and drain contact layers electrically conductive are provided within the source and drain contact holes 14 respectively so that the source and drain contact layers provide electrical connections between the metal interconnection 11 and the source and drain regions 4 and 3. Further the body contact holes 15 have inner walls which are covered by body contact hole insulation films 12. Body contact layers electrically conductive are provided in the body contact holes 15 coated by the body contact hole insulation films 12 so that the body contact layer provides an electrical connection between the p+-type high impurity concentration region 6 and the metal interconnection 11, whereby a current path is formed from the channel region 5 through the p+-type high impurity concentration region 6 and the body contact layer to the metal interconnection 11. The current path allows the holes generated in the channel region 5 to withdraw or discharge through the p+-type high impurity concentration region 6 and the body contact layer to the metal interconnection 11.

The body contact hole insulation film 12 electrically isolate the body contact layer from the source region 4 so that no short circuit is formed between the p+-type high impurity concentration region 6 and the source region 4. This means that the potential of the p+-type high impurity concentration region 6 is independent from the source potential of the source region 4. The potential of the channel region 5 is not fixed at the same potential as the source potential of the source region 4. The above body contact hole structure makes it possible to control the channel potential of the channel region 5 and the source potential of the source region 4 independently. Namely, the channel potential of the channel region 5 is controllable independently from the control of the source potential of the source region 4. This means that the threshold voltage of the transistor is desirably controllable by controlling the channel potential of the channel region 5.

The above novel body contact hole structure forms the current path for withdrawing and discharging holes from the channel region 5. The current path allows holes generated in the channel region 5 to discharge or withdraw through the p+-type high impurity concentration region 6, the body contact layer within the body contact hole 15 to the metal interconnection 11. The above current path allows the transistor to be free from the problems with the kink effects and parasitic bipolar transistor effects.

The above novel body contact hole structure does not require any enlargement in area for providing an additional element, for which reason the above novel body contact hole structure allows realization of high integration of the transistor and a substantive scaling down or size reduction of the transistor.

Further, the above novel body contact hole structure allows the source region to extend almost entirely in an opposite side to the drain region. This means that the source region is allowed to have a sufficiently large width for permitting the transistor to have a sufficiently high driving current.

Furthermore, the drain region is provided in contact directly with the insulating substrate 1' thereby to form no parasitic capacitance at the p-n junction on the bottom of the drain region. This allows the transistor to exhibit high speed performances.

Fifth Embodiment

Figure 15:
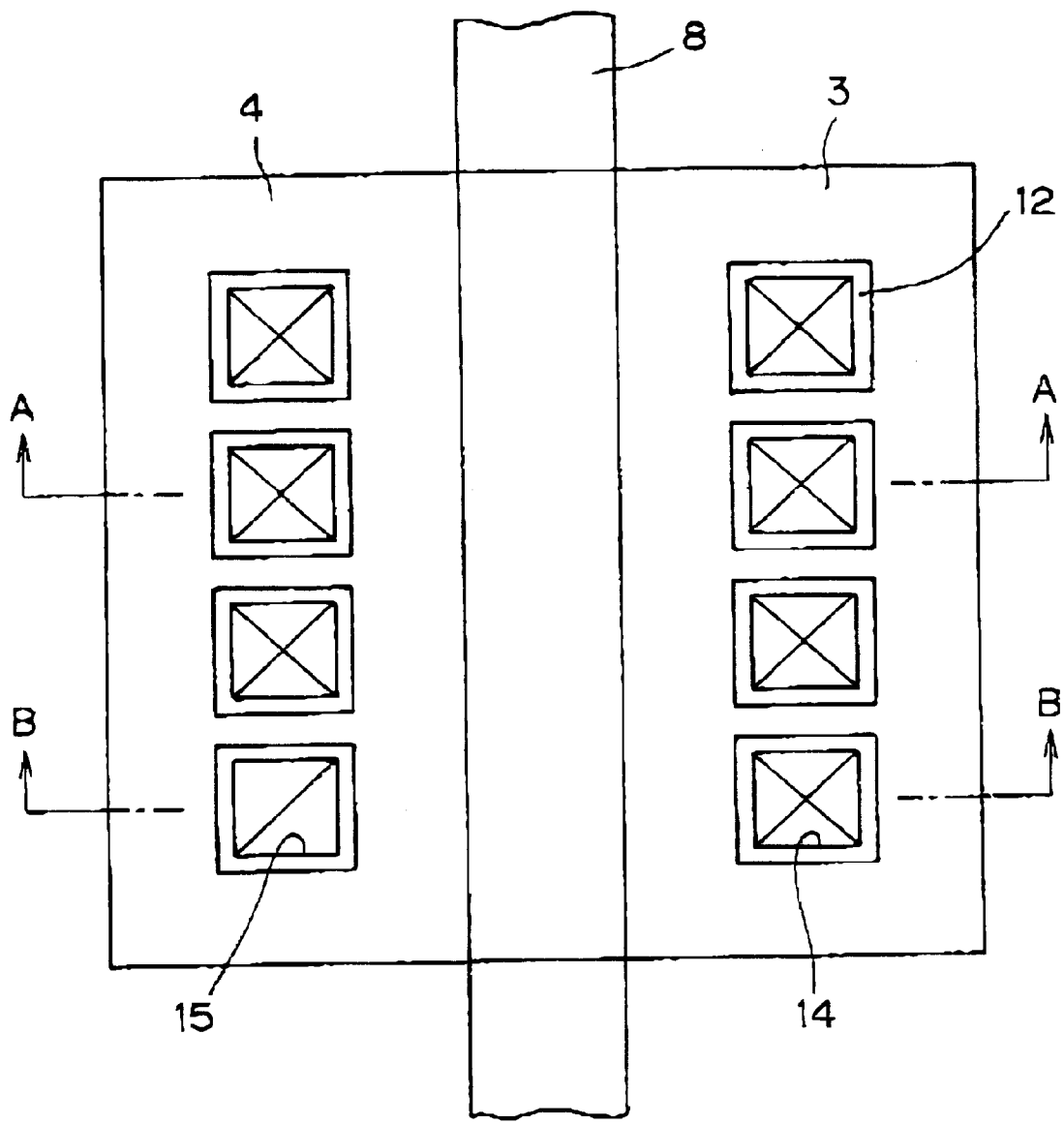
FIG. 15 is a plane view illustrative of a novel SOI-MOS field effect transistor with body contact holes in a fifth embodiment in accordance with the present invention.
Figure 16A:
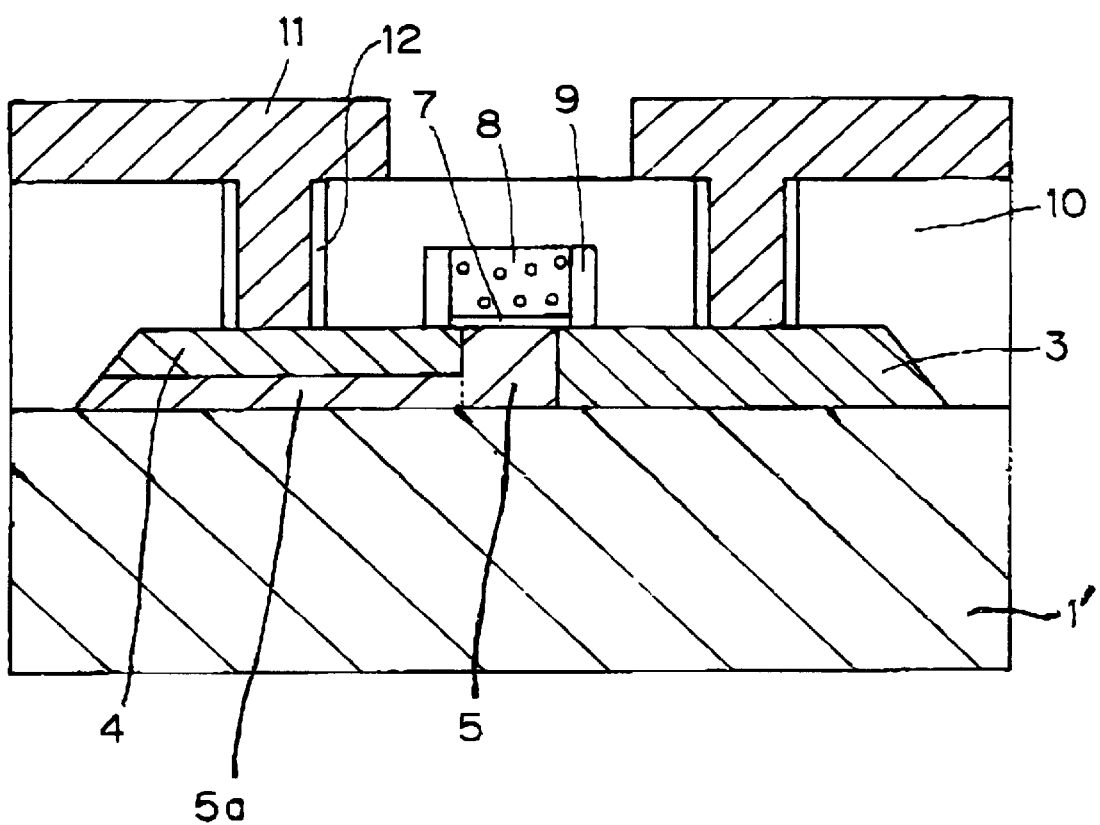
FIG. 16A is a fragmentary cross sectional elevation view illustrative of a novel SOI-MOS field effect transistor with body contact holes taken along an 16A—16A line of FIG. 15 in a fifth embodiment in accordance with the present invention.
Figure 16B:
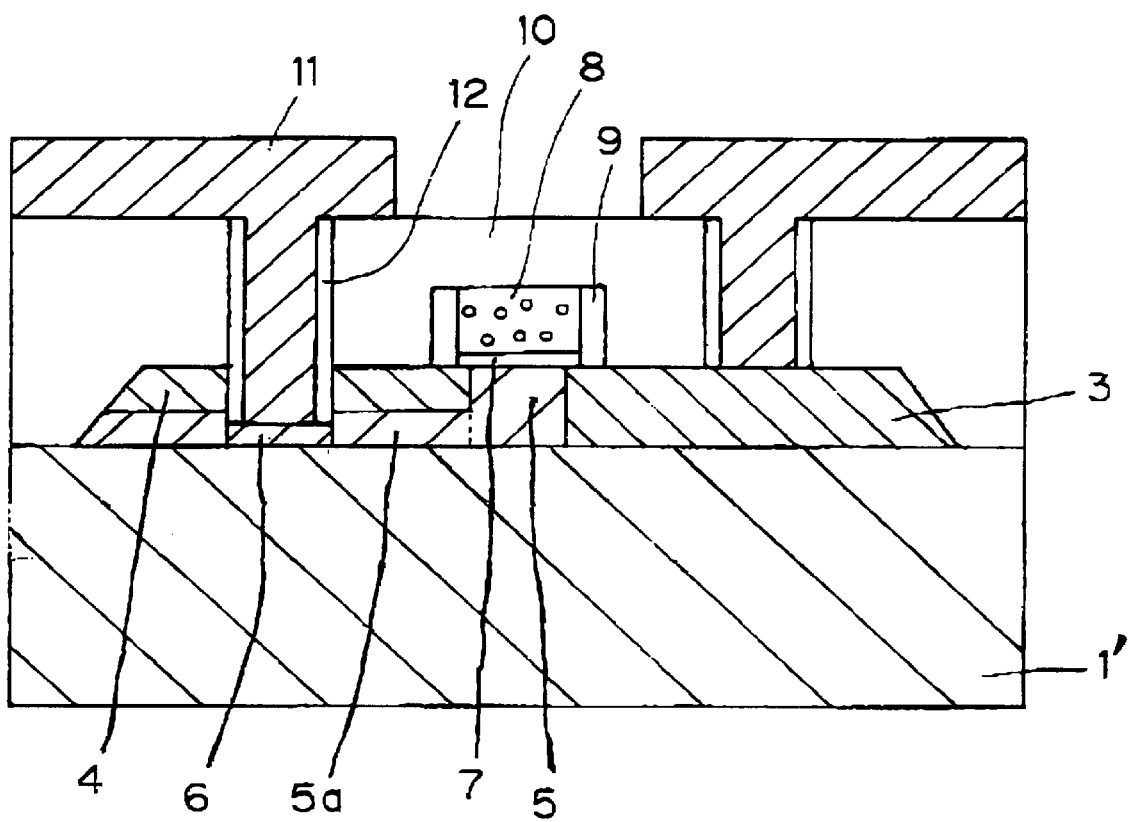
FIG. 16B is a fragmentary cross sectional elevation view illustrative of a novel SOI-MOS field effect transistor with body contact holes taken along a 16B—16B line of FIG. 15 in a fifth embodiment in accordance with the present invention.

A fifth embodiment according to the present invention will be described in detail with reference to FIGS. 15, 16A and 16B. A novel SOS-MOS field effect transistor with an improved body contact structure is provided. A silicon-on-substrate layer made of silicon is selectively provided on an insulating substrate 1'. A silicon-on-substrate layer made of silicon is selectively provided on the insulating substrate 1' so that the silicon-on-substrate layer is electrically isolated by the insulating substrate 1' from the silicon substrate 1. The silicon-on-substrate layer comprises a p--type low impurity concentration region 5a, an n+-type drain region 3, an n+-type source region 4 laminated on the p--type low impurity concentration region 5a and a p--type channel region 5 between the source and drain regions 4 and 3. The drain region 3 is directly contact with the insulating substrate 1'. A gate insulation film 7 is selectively provided on the channel region 5. A gate electrode 8 is provided on the gate insulation film 7. Side wall oxide films 9 are provided on opposite sides of the gate electrode 8. An inter-layer insulator 10 is provided which covers the source and drain regions 4 and 3 and the gate electrode 8 with the side wall oxide films 9. Metal interconnections 11 are provided which extend over the inter-layer insulator 10. Source and drain contact holes 14 are formed in the inter-layer insulator 10 and over the source and drain regions 4 and 3 respectively and under the metal interconnections 11 so that the source and drain contact holes 14 reach the top surface of the source and drain regions 4 and 3 respectively. Further, body contact holes 15 are formed in the inter-layer insulator 10 and over the source region 4 and under the metal interconnection 11 so that the body contact hole 15 penetrates through the source region 4 to reach p+-type high impurity concentration regions 6 formed in the p--type low impurity concentration region 5a. The source contact holes 14 and the body contact holes 15 are alternately aligned in a channel width direction as well illustrated in FIG. 15. Source and drain hole insulation layers 12 are provided on inner walls of the source and drain contact holes 14 respectively. Source and drain contact layers electrically conductive are provided within the source and drain contact holes 14 respectively so that the source and drain contact layers provide electrical connections between the metal interconnection 11 and the source and drain regions 4 and 3. Further the body contact holes 15 have inner walls which are covered by body contact hole insulation films 12. Body contact layers electrically conductive are provided in the body contact holes 15 coated by the body contact hole insulation films 12 so that the body contact layer provides an electrical connection between the p+-type high impurity concentration regions 6 and the metal interconnection 11, whereby a current path is formed from the channel region 5 through the p--type low impurity concentration region 5a, the p+-type high impurity concentration regions 6 and the body contact layer to the metal interconnection 11. The current path allows the holes generated in the channel region 5 to withdraw or discharge through the p--type low impurity concentration region 5a, the p+-type high impurity concentration regions 6 and the body contact layer to the metal interconnection 11.

The body contact hole insulation film 12 electrically isolate the body contact layer from the source region 4 so that no short circuit is formed between the p--type low impurity concentration region 5a and the source region 4. This means that the potentials of the p--type low impurity concentration region 5a and the p+-type high impurity concentration regions 6 are independent from the source potential of the source region 4. The potential of the channel region 5 is not fixed at the same potential as the source potential of the source region 4. The above body contact hole structure makes it possible to control the channel potential of the channel region 5 and the source potential of the source region 4 independently. Namely, the channel potential of the channel region 5 is controllable independently from the control of the source potential of the source region 4. This means that the threshold voltage of the transistor is desirably controllable by controlling the channel potential of the channel region 5.

The above novel body contact hole structure forms the current path for withdrawing and discharging holes from the channel region 5. The current path allows holes generated in the channel region 5 to discharge or withdraw through the p--type low impurity concentration region 5a, the p+-type high impurity concentration regions 6, and the body contact layer within the body contact hole 15 to the metal interconnection 11. The above current path allows the transistor to be free from the problems with the kink effects and parasitic bipolar transistor effects.

The above novel body contact hole structure does not require any enlargement in area for providing an additional element, for which reason the above novel body contact hole structure allows realization of high integration of the transistor and a substantive scaling down or size reduction of the transistor.

Further, the above novel body contact hole structure allows the source region to extend almost entirely in an opposite side to the drain region. This means that the source region is allowed to have a sufficiently large width for permitting the transistor to have a sufficiently high driving current.

Furthermore, the drain region is provided in contact directly with the insulating substrate 1' thereby to form no parasitic capacitance at the p-n junction on the bottom of the drain region. This allows the transistor to exhibit high speed performances.

Whereas in the foregoing embodiments, the above novel body hole structure has been applied to the n-channel field effect transistors, the above novel body hole structure may be applicable to the p-channel field effect transistors and also to CMOS devices.

Further, a sapphire substrate is, for example available as the insulating substrate.

Further more, in place of the insulating substrate, a semi-insulating substrate is also available.

In place of the silicon-on-insulator layer made of silicon over the insulation layer or the insulation substrate, a semiconductor-on-insulation layer may include partially or entirely SiGe or other compound semiconductors.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A contact hole structure in a field effect transistor having a semiconductor layer extending over an insulation region, a control electrode provided on an insulation film on said semiconductor layer, and an inter-layer insulator covering said semiconductor layer and said control electrode, said semiconductor layer further comprising a drain region of a first conductivity type extending on said insulation region, an intermediate region of a second conductivity type extending on said insulation region and also being in contact with said drain region so that said intermediate region is positioned under said control electrode, and a laminated region in contact with said intermediate region so that said laminated region is separated by said intermediate region from said drain region, said laminated region comprising a base layer of said second conductivity type on said insulation region and a source region of said first conductivity type laminated on said base layer, wherein said contact hole structure comprises:
at least a first contact hole filled with a first contact layer and formed in said inter-layer insulator so that said first contact hole reaches a top surface of said source region;
at least a second contact hole filled with a second contact layer and formed in said inter-layer insulator so that said second contact hole penetrates through said source region to reach said base layer; and
an electrical isolation layer provided on an inner wall of at least a part of said second contact hole so that said second contact layer within said second contact hole is electrically isolated by said electrical isolation layer from said source region.

2. The contact hole structure as claimed in claim 1, wherein said second contact layer is in direct contact with said base layer.

3. The contact hole structure as claimed in claim 1, further comprising a high impurity concentration layer of said second conductivity type having a higher impurity concentration than that of said base layer, said high impurity concentration layer being provided on a bottom of said second contact hole so that said second contact layer within said second contact hole is in indirectly contact through said high impurity concentration layer to said base layer.

4. The contact hole structure as claimed in claim 3, wherein said electrical isolation layer is provided on said inner wall of said second contact hole so that said second contact layer within said second contact hole is electrically isolated by said electrical isolation layer from said source region and also from said base layer, and so that said second contact layer within said second contact hole is in indirectly contact through said high impurity concentration layer to said base layer.

5. The contact hole structure as claimed in claim 1, wherein said electrical isolation layer is provided on an entire of said inner wall of said second contact bole.

6. The contact hole structure as claimed in claim 1, wherein a plurality of said first contact holes and a plurality of said second contact holes are provided to be aligned alternately.

7. The contact hole structure as claimed in claim 6, wherein said first and second contact holes are so aligned as to have the same distance from said control electrode.

8. The contact hole structure as claimed in claim 1, wherein said insulation region comprises a buried insulation layer extending over a semiconductor substrate.

9. The contact hole structure as claimed in claim 1, wherein said insulation region comprises an insulation substrate.

10. The contact hole structure as claimed in claim 1, wherein said insulation region comprises an semi-insulation substrate.

11. A source contact hole structure formed in an inter-layer insulator over a source region of a first conductivity type extending on a base layer of a second conductivity, wherein said source contact hole structure comprises:
at least a first contact hole filled with a first contact layer and formed in said inter-layer insulator so that said first contact hole reaches a top surface of said source region;
at least a second contact hole filled with a second contact layer and formed in said inter-layer insulator so that said second contact hole penetrates through said source region to reach said base layer; and
an electrical isolation layer provided on an inner wall of at least a part of said second contact hole so that said second contact layer within said second contact hole is electrically isolated by said electrical isolation layer from said source region.

12. The source contact hole structure as claimed in claim 11, wherein said second contact layer is in direct contact with said base layer.

13. The source contact hole structure as claimed in claim 11, further comprising a high impurity concentration layer of said second conductivity type having a higher impurity concentration than that of said base layer, said high impurity concentration layer being provided on a bottom of said second contact hole so that said second contact layer within said second contact hole is in indirectly contact through said high impurity concentration layer to said base layer.

14. The source contact hole structure as claimed in claim 13, wherein said electrical isolation layer is provided on said inner wall of said second contact hole so that said second contact layer within said second contact hole is electrically isolated by said electrical isolation layer from said source region and also from said base layer, and so that said second contact layer within said second contact hole is in indirectly contact through said high impurity concentration layer to said base layer.

15. The source contact hole structure as claimed in claim 11, wherein said electrical isolation layer is provided on an entire of said inner wall of said second contact hole.

16. The source contact hole structure as claimed in claim 11, wherein a plurality of said first contact holes and a plurality of said second contact holes are provided to be aligned alternately.

17. A field effect transistor comprising:

an insulation region;

a semiconductor layer extending over said insulation region, said semiconductor layer further comprising a drain region of a first conductivity type extending on said insulation region, a channel region of a second conductivity type extending on said insulation region and also being in contact with said drain region, and a laminated region in contact with said channel region so that said laminated region is separated by said channel region from said drain region, said laminated region comprising a base layer of said second conductivity type on said insulation region and a source region of said first conductivity type laminated on said base layer;

a gate insulation film provided on said channel region;

a gate electrode provided on said insulation film;

an inter-layer insulator covering said semiconductor layer and said gate electrode, and a contact hole structure, wherein said contact hole structure comprises:

at least a first contact hole filled with a first contact layer and formed in said inter-layer insulator so that said first contact hole reaches a top surface of said source region;

at least a second contact hole filled with a second contact layer and formed in said inter-layer insulator so that said second contact hole penetrates through said source region to reach said base layer; and an electrical isolation layer provided on an inner wall of at least a part of said second contact hole so that said second contact layer within said second contact hole is electrically isolated by said electrical isolation layer from said source region.

18. The field effect transistor as claimed in claim 17, wherein said second contact layer is in direct contact with said base layer.

19. The field effect transistor as claimed in claim 17, further comprising a high impurity concentration layer of said second conductivity type having a higher impurity concentration than that of said base layer, said high impurity concentration layer being provided on a bottom of said second contact hole so that said second contact layer within said second contact hole is in indirectly contact through said high impurity concentration layer to said base layer.

20. The field effect transistor as claimed in claim 19, wherein said electrical isolation layer is provided on said inner wall of said second contact hole so that said second contact layer within said second contact hole is electrically isolated by said electrical isolation layer from said source region and also from said base layer, and so that said second contact layer within said second contact hole is in indirectly contact through said high impurity concentration layer to said base layer.

21. The field effect transistor as claimed in claim 17, wherein said electrical isolation layer is provided on an entire of said inner wall of said second contact hole.

22. The field effect transistor as claimed in claim 17, wherein a plurality of said first contact holes and a plurality of said second contact holes are provided to be aligned alternately.

23. The field effect transistor as claimed in claim 22, wherein said first and second contact holes are so aligned as to have the same distance from said gate electrode.

24. The field effect transistor as claimed in claim 17, wherein said insulation region comprises a buried insulation layer extending over a semiconductor substrate.

25. The field effect transistor as claimed in claim 17, wherein said insulation region comprises an insulation substrate.

26. The field effect transistor as claimed in claim 17, wherein said insulation region comprises an semi-insulation substrate.

27. A field effect transistor comprising:

a semiconductor substrate;

a buried insulation layer extending on said semiconductor substrate;

a semiconductor-on-insulation layer made of a semiconductor extending over said buried insulation layer, said semiconductor-on-insulation layer further comprising a drain region of a first conductivity type extending on said buried insulation layer, a channel region of a second conductivity type extending on said buried insulation layer and also being in contact with said drain region, and a laminated region in contact with said channel region so that said laminated region is separated by said channel region from said drain region, said laminated region comprising a base layer of said second conductivity type on said buried insulation layer and a source region of said first conductivity type laminated on said base layer;

a gate insulation film provided on said channel region;

a gate electrode provided on said insulation film;

an inter-layer insulator covering said semiconductor layer and said gate electrode, and a contact hole structure, wherein said contact hole structure comprises:

at least a first contact hole filled with a first contact layer and formed in said inter-layer insulator so that said first contact hole reaches a top surface of said source region;

at least a second contact hole filled with a second contact layer and formed in said inter-layer insulator so that said second contact hole penetrates through said source region to reach said base layer; and an electrical isolation layer provided on an inner wall of at least a part of said second contact hole so that said second contact layer within said second contact hole is electrically isolated by said electrical isolation layer from said source region.

28. The field effect transistor as claimed in claim 27, wherein said second contact layer is in direct contact with said base layer.

29. The field effect transistor as claimed in claim 27, further comprising a high impurity concentration layer of said second conductivity type having a higher impurity concentration than that of said base layer, said high impurity concentration layer being provided on a bottom of said second contact hole so that said second contact layer within said second contact hole is in indirectly contact through said high impurity concentration layer to said base layer.

30. The field effect transistor as claimed in claim 29, wherein said electrical isolation layer is provided on said inner wall of said second contact hole so that said second contact layer within said second contact hole is electrically isolated by said electrical isolation layer from said source region and also from said base layer, and so that said second contact layer within said second contact hole is in indirectly contact through said high impurity concentration layer to said base layer.

31. The field effect transistor as claimed in claim 27, wherein said electrical isolation layer is provided on an entire of said inner wall of said second contact hole.

32. The field effect transistor as claimed in claim 27, wherein a plurality of said first contact holes and a plurality of said second contact holes are provided to be aligned alternately.

33. The field effect transistor as claimed in claim 32, wherein said first and second contact holes are so aligned as to have the same distance from said gate electrode.

34. A field effect transistor comprising:
an insulation substrate;
a semiconductor-on-insulation layer made of a semiconductor extending over said insulation substrate, said semiconductor-on-insulation layer further comprising a drain region of a first conductivity type extending on said insulation substrate, a channel region of a second conductivity type extending on said insulation substrate and also being in contact with said drain region, and a laminated region in contact with said channel region so that said laminated region is separated by said channel region from said drain region, said laminated region comprising a base layer of said second conductivity type on said insulation substrate and a source region of said first conductivity type laminated on said base layer;
a gate insulation film provided on said channel region;
a gate electrode provided on said insulation film;
an inter-layer insulator covering said semiconductor layer and said gate electrode, and a contact hole structure,
wherein said contact hole structure comprises:
at least a first contact hole filled with a first contact layer and formed in said inter-layer insulator so that said first contact hole reaches a top surface of said source region;
at least a second contact hole filled with a second contact layer and formed in said inter-layer insulator so that said second contact hole penetrates through said source region to reach said base layer; and
an electrical isolation layer provided on an inner wall of at least a part of said second contact hole so that said second contact layer within said second contact hole is electrically isolated by said electrical isolation layer from said source region.

35. The field effect transistor as claimed in claim 34, wherein said second contact layer is in direct contact with said base layer.

36. The field effect transistor as claimed in claim 34, further comprising a high impurity concentration layer of said second conductivity type having a higher impurity concentration than that of said base layer, said high impurity concentration layer being provided on a bottom of said second contact hole so that said second contact layer within said second contact hole is in indirectly contact through said high impurity concentration layer to said base layer.

37. The field effect transistor as claimed in claim 36, wherein said electrical isolation layer is provided on said inner wall of said second contact hole so that said second contact layer within said second contact hole is electrically isolated by said electrical isolation layer from said source region and also from said base layer, and so that said second contact layer within said second contact hole is in indirectly contact through said high impurity concentration layer to said base layer.

38. The field effect transistor as claimed in claim 34, wherein said electrical isolation layer is provided on an entire of said inner wall of said second contact hole.

39. The field effect transistor as claimed in claim 34, wherein a plurality of said first contact holes and a plurality of said second contact holes are provided to be aligned alternately.

40. The field effect transistor as claimed in claim 39, wherein said first and second contact holes are so aligned as to have the same distance from said gate electrode.

* * * * *